United States Patent
Zhao

(10) Patent No.: US 11,402,685 B2
(45) Date of Patent: Aug. 2, 2022

(54) DISPLAY SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventor: Dejiang Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 2 days.

(21) Appl. No.: 16/902,711

(22) Filed: Jun. 16, 2020

(65) Prior Publication Data
US 2021/0011340 A1    Jan. 14, 2021

(30) Foreign Application Priority Data
Jul. 10, 2019  (CN) .......................... 201910621036.4

(51) Int. Cl.
G02F 1/1335    (2006.01)
H01L 27/32    (2006.01)
(Continued)

(52) U.S. Cl.
CPC ...... *G02F 1/133553* (2013.01); *G02F 1/1336* (2013.01); *G02F 1/133504* (2013.01); *G02F 1/133512* (2013.01); *G02F 1/133514* (2013.01); *G02F 1/133602* (2013.01); *G02F 1/133605* (2013.01); *G02F 1/133608* (2013.01); *H01L 27/322* (2013.01); *H01L 51/502* (2013.01); *H01L 51/5271* (2013.01); *H01L 51/5284* (2013.01); *H01L 51/56* (2013.01)

(58) Field of Classification Search
CPC ............. G02F 1/1336; G02F 1/133602; G02F 1/133605; G02F 1/133608; G02F 1/133553; G02F 1/133504; G02F 1/133512; G02F 1/133514
See application file for complete search history.

(56) References Cited

U.S. PATENT DOCUMENTS

| 2011/0134360 A1* | 6/2011 | Ueno | G02B 6/002 349/62 |
|---|---|---|---|
| 2020/0073167 A1 | 3/2020 | Shi et al. | |
| 2020/0150327 A1 | 5/2020 | Yang et al. | |

FOREIGN PATENT DOCUMENTS

| CN | 106019789 A | 10/2016 |
|---|---|---|
| CN | 108873465 A | 11/2018 |

(Continued)

OTHER PUBLICATIONS

Notification of the First Office Action issued in Chinese Patent Application No. 201910621036 4, dated Jun. 15, 2021, with English translation.

*Primary Examiner* — Dung T Nguyen
(74) *Attorney, Agent, or Firm* — McDermott Will & Emery LLP

(57) ABSTRACT

A display substrate includes a base, and at least one light output device and at least one reflecting device both disposed above the base. The at least one light output device and the at least one reflecting device are disposed adjacent to each other. Each reflecting device is configured to reflect incident light that is incident to the reflecting device in a direction perpendicular to the base into one or more light output devices disposed on a side of the reflecting device. Each light output device is configured to emit display light in response to the received incident light.

18 Claims, 21 Drawing Sheets

(51) Int. Cl.
*H01L 51/50* (2006.01)
*H01L 51/52* (2006.01)
*H01L 51/56* (2006.01)
*G02F 1/13357* (2006.01)

(56) References Cited

FOREIGN PATENT DOCUMENTS

| | | |
|---|---|---|
| CN | 109387975 A | 2/2019 |
| CN | 109765728 A | 5/2019 |
| JP | H10-039136 A | 2/1998 |

\* cited by examiner

DISPLAY SUBSTRATE AND METHOD FOR MANUFACTURING THE SAME, AND DISPLAY APPARATUS

CROSS-REFERENCE TO RELATED APPLICATION

This application claims priority to Chinese Patent Application No. 201910621036.4, filed on Jul. 10, 2019, which is incorporated herein by reference in its entirety.

TECHNICAL FIELD

The present disclosure relates to the field of display technologies, and in particular, to a display substrate and a method for manufacturing the same, and a display apparatus.

BACKGROUND

With the continuous development of display technology, people have higher requirements on the display quality of display apparatuses.

A quantum dot, as a semiconductor nanocrystal, is usually spherical or quasi-spherical, with a diameter of 1 nm to 100 nm. The quantum dot can emit light of a certain wavelength range excited by an electric field or light. Since the diameter of the quantum dot is less than or proximate to the exciton Bohr radius of corresponding semiconductor material, a quantum confinement effect occurs, that is, the electron energy level near the Fermi level in the quantum dot is split into a discrete state from a continuous state. In this way, the width of the band gap of the quantum dot can be adjusted by changing the diameter of the quantum dot, thereby controlling the wavelength range of light emitted by the quantum dot, that is, the color of the emitted light.

Therefore, an application of quantum dots to display apparatuses attracts much attention because it may provide the display apparatuses with many advantages such as long service life and wide color gamut.

SUMMARY

The embodiments of the present disclosure provide a display substrate and a method for manufacturing the same, and a display apparatus, which are capable of making at least one light output device in the display substrate emit display light in response to reflected incident light.

In order to achieve this objective, the embodiments of the present disclosure adopt the following technical solutions:

In first aspect of the present disclosure, a display substrate is provided. The display substrate includes a base, and at least one light output device and at least one reflecting device both disposed above the base. The at least one light output device and the at least one reflecting device are disposed adjacent to each other. Each reflecting device is configured to reflect incident light that is incident to the reflecting device in a direction perpendicular to the base into one or more light output devices disposed on a side of the reflecting device. Each light output device is configured to emit display light in response to the received incident light.

In a possible implementation manner of the first aspect of the disclosure, the reflecting device includes a reflecting structure, and the reflecting structure includes a first structure made of a reflecting material. The first structure includes a first reflecting surface inclined with respect to the base, and the first reflecting surface is configured to reflect the incident light that is incident to the first reflecting surface into the one or more light output devices disposed on a side of the first reflecting surface.

In another possible implementation manner of the first aspect of the disclosure, the reflecting structure further includes a second structure made of a light-transmitting material, and the second structure is disposed on a side of the first reflecting surface facing the one or more light output devices disposed on the side of the first reflecting surface.

In yet another possible implementation manner of the first aspect of the disclosure, the first structure further includes a second reflecting surface facing away from the first reflecting surface and perpendicular to the base.

In yet another possible implementation manner of the first aspect of the disclosure, an included angle between the first reflecting surface and the base is within a range of 42° to 48°, inclusive.

In yet another possible implementation manner of the first aspect of the disclosure, the reflecting device further includes a first light-shielding layer, and the reflecting structure and the first light-shielding layer are stacked successively in a direction of the incident light that is incident to the reflecting device.

In yet another possible implementation manner of the first aspect of the disclosure, the reflecting device includes a reflecting structure, and the reflecting structure includes a first structure and a second structure. The second structure is closer to the one or more light output devices disposed on the side of the reflecting device than the first structure. The first structure includes a transmission sub-portion that is in contact with the second structure and made of a first light-transmitting material. The second structure is made of a second light-transmitting material, and a refractive index of the second light-transmitting material is greater than a refractive index of the first light-transmitting material. The second structure includes a first reflecting surface inclined with respect to the base and in contact with the transmission sub-portion, and the first reflecting surface is configured to reflect the incident light that is incident to the first reflecting surface into the one or more light output devices disposed on a side of the first reflecting surface.

In yet another possible implementation manner of the first aspect of the disclosure, the first structure further includes a light-shielding sub-portion disposed on a side of the transmission sub-portion facing away from the second structure and perpendicular to the base.

In yet another possible implementation manner of the first aspect of the disclosure, an included angle between the first reflecting surface and the base is within a range of 42° to 48°, inclusive.

In yet another possible implementation manner of the first aspect of the disclosure, the reflecting device further includes a first light-shielding layer, and the reflecting structure and the first light-shielding layer are stacked successively in a direction of the incident light that is incident to the reflecting device.

In yet another possible implementation manner of the first aspect of the disclosure, the at least light output device includes a plurality of light output devices, and the at least one reflecting device includes a plurality of reflecting devices. The plurality of reflecting devices and the plurality of light output devices are arranged in at least one of following ways: a side of one light output device corresponds to one reflecting device; a side of one light output device corresponds to some of the plurality of reflecting devices; or some of the plurality of light output devices correspond to one reflecting device.

In yet another possible implementation manner of the first aspect of the disclosure, the base has a plurality of sub-pixel regions, and each light output device is disposed in one sub-pixel region.

In yet another possible implementation manner of the first aspect of the disclosure, the plurality of light output devices include a plurality of groups, and the display light emitted by light output devices in each group has a same color. The base has a plurality of sub-pixel regions, and each group and one or more reflecting devices corresponding to the group are disposed in one sub-pixel region.

In yet another possible implementation manner of the first aspect of the disclosure, one light output device includes: a second light-shielding layer and a light output layer successively stacked in an exit direction of the display light. The light output layer includes a quantum dot light-emitting layer or a diffuse reflecting layer.

In yet another possible implementation manner of the first aspect of the disclosure, the at least one light output device includes: at least one red light conversion device configured to emit red display light in response to the received incident light; and at least one green light conversion device configured to emit green display light in response to the received incident light; and at least one blue light conversion device configured to emit blue display light in response to the received incident light; or, at least one blue light reflecting device each including a diffuse reflecting layer, the diffuse reflecting layer including a plurality of diffusion particles configured to reflect incident light that is incident into the blue light reflecting device out of the blue light reflecting device.

In second aspect of the present disclosure, a display apparatus is provided. The display apparatus includes the display substrate described above and a light source configured to provide the incident light to the display substrate.

In a possible implementation manner of the second aspect of the disclosure, the light source is configured to provide blue incident light, and the at least one light output device includes at least one red light conversion device, at least one green light conversion device and at least one blue light reflecting device. Each red light conversion device is configured to emit red display light in response to the received incident light; each green light conversion device is configured to emit green display light in response to the received incident light; and each blue light reflecting device includes a diffuse reflecting layer, the diffuse reflecting layer including a plurality of diffusion particles configured to reflect the blue incident light that is incident into the blue light reflecting device out of the blue light reflecting device. Or, the light source is configured to provide violet incident light, and the at least one light output device includes at least one red light conversion device, at least one green light conversion device and at least one blue light conversion device. Each red light conversion device is configured to emit red display light in response to the received violet incident light; each green light conversion device is configured to emit green display light in response to the received violet incident light; and each blue light conversion device is configured to emit blue display light in response to the received violet incident light.

In third aspect of the present disclosure, a method for preparing a display substrate is provided. The method includes forming, above a base, at least one reflecting device and at least one light output device. The at least one light output device and the at least one reflecting device are disposed adjacent to each other, each reflecting device is configured to reflect incident light that is incident to the reflecting device in a direction perpendicular to the base into one or more light output devices disposed on a side of the reflecting device, and each light output device is configured to emit display light in response to the received incident light.

In a possible implementation manner of the third aspect of the disclosure, forming, above the base, the at least one reflecting device includes: forming, above the base, a plurality of spaced-apart transition patterns; a section of each transition pattern in a direction perpendicular to the base being trapezoidal, and a length of a first side of the section proximate to the base being greater than a length of a second side of the section away from the base; etching the plurality of transition patterns to form a plurality of spaced-apart second structures; with respect to the base, a side face of each second structure being an inclined face; forming a transition layer on a side of the base on which the plurality of second structures are formed; and etching the transition layer to form a plurality of spaced-apart first structures in one-to-one correspondence to the plurality of second structures; each reflecting device including one first structure and one corresponding second structure, and the first structure being in contact with the inclined face of the corresponding second structure.

In another possible implementation manner of the third aspect of the disclosure, after the first structure in contact with the inclined face of the second structure is formed, forming at least one reflecting device on the base further includes: forming a first light-shielding layer on a side of each first structure and one corresponding second structure facing away from the base.

BRIEF DESCRIPTION OF THE DRAWINGS

In order to describe technical solutions in the embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain some other drawings according to these drawings. In addition, the accompanying drawings in the following description may be regarded as schematic diagrams, and are not limitations on actual sizes of products, an actual process of a method and actual timings of signals that the embodiments of the present disclosure relate to.

DETAILED DESCRIPTION

Figure 1:
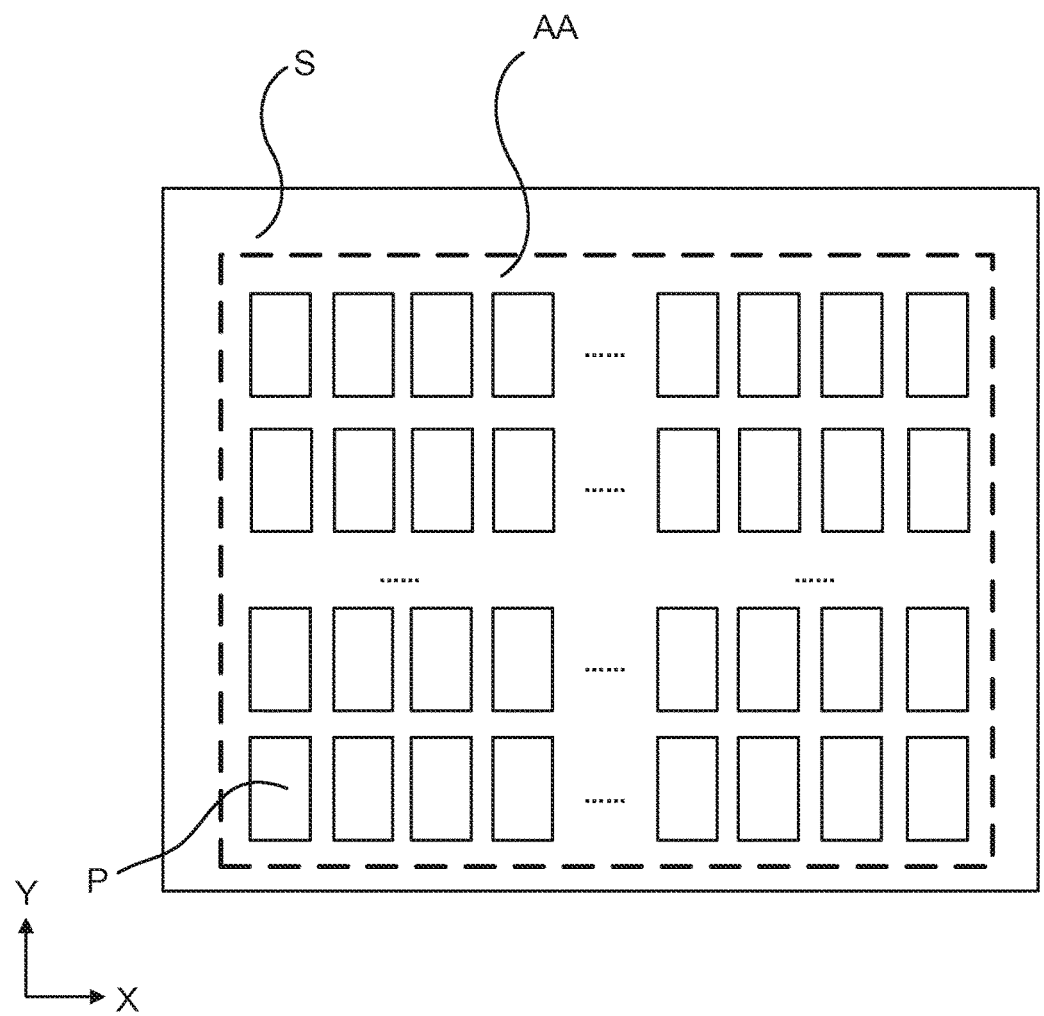
FIG. 1 is a schematic top view of a structure of a display panel, according to some embodiments of the present disclosure.

Technical solutions in some embodiments of the present disclosure will be described clearly and completely below in combination with accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise/include" and other forms thereof such as the third-person singular form "comprises/includes" and the present participle form "comprising/including" in the description and the claims are construed as open and inclusive, i.e., "inclusive, but not limited to". In the description, the terms such as "one embodiment", "some embodiments", "exemplary embodiments", "example", "specific example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

The expression of "at least one of A, B and/or C" includes the following combinations of A, B and C: only A, only B, only C, A and B, A and C, B and C, A and B and C.

Hereinafter, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified. As used in this specification and the appended claims, the singular forms "a," "an," and "the" include plural referents unless the content clearly dictates otherwise.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the terms such as "coupled" or "communicatively coupled" may also mean that two or more components are not in direct contact with each other but still cooperate or interact with each other. The embodiments disclosed herein are not necessarily limited to the contents herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Some embodiments of the present disclosure provide a display apparatus, the display apparatus includes a display panel.

As shown in FIG. 1, the display panel has a display area (usually also called active display area) AA and a peripheral area S.

According to different designs of the display panel, the specific position of the peripheral area S may be changed correspondingly. For example, the peripheral area S surrounds the display area AA; or, the peripheral area S is on one side or a plurality of sides of the periphery of the display area AA, but not surrounding the display area AA.

As shown in FIG. 1, the display panel includes a plurality of sub-pixels P in the display area AA. The plurality of sub-pixels P include sub-pixels of a first color, sub-pixels of a second color, and sub-pixels of a third color. The first color, the second color and the third color are three primary colors (for example, red, green and blue).

For convenience of description, the embodiments of the present disclosure are described by taking an example in which the plurality of sub-pixels P are arranged in an array. In this case, sub-pixels P arranged in a line in a row direction (e.g., an X direction as shown in FIG. 1) are referred to as a same row of sub-pixels. Sub-pixels P arranged in a line in a column direction (e.g., a Y direction as shown in FIG. 1) are referred to as a same column of sub-pixels.

In some embodiments, sub-pixels in a same row may be connected to one gate line, and sub-pixels in a same column may be connected to one data line.

The display panel may be, for example, a liquid crystal display panel or a self-luminescence display panel.

Figure 2:
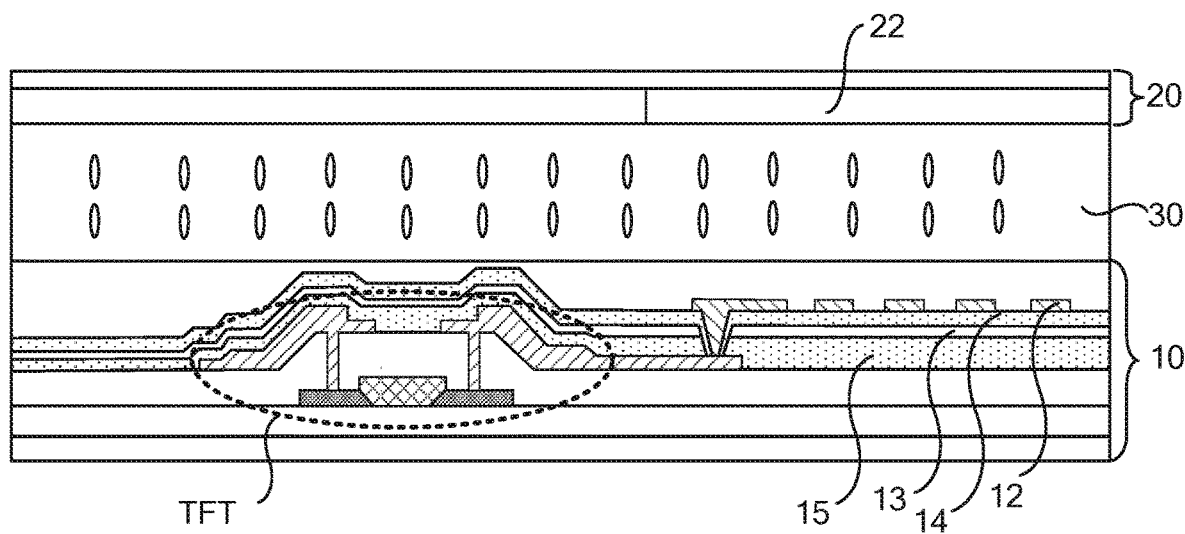
FIG. 2 is a schematic sectional view of a structure of a display panel, according to some embodiments of the present disclosure.

In some embodiments, the display panel is a liquid crystal display panel. As shown in FIG. 2, the liquid crystal display panel includes an array substrate 10, a color film substrate 20, and a liquid crystal layer 30 disposed between the array substrate 10 and the color film substrate 20.

As shown in FIG. 2, each sub-pixel P includes a thin film transistor (TFT) and a pixel electrode 12.

In some embodiments, the array substrate 10 further includes a common electrode 13. For example, the pixel electrode 12 and the common electrode 13 are disposed in a same layer. For another example, the pixel electrode 12 and the common electrode 13 are disposed in different layers.

In a case where the pixel electrode 12 and the common electrode 13 are disposed in a same layer, both the pixel electrode 12 and the common electrode 13 are of a comb structure including a plurality of strip-shaped sub-electrodes.

In a case where the pixel electrode 12 and the common electrode 13 are disposed in different layers, as shown in FIG. 2, the array substrate 10 further includes a first insulating layer 14 disposed between the pixel electrode 12 and the common electrode 13. In this case, if the common electrode is further disposed between the TFT and the pixel electrode, as shown in FIG. 2, the array substrate 10 further includes a second insulating layer 15 disposed between the common electrode 13 and the TFT.

In some other embodiments, the common electrode 13 is disposed in the color film substrate 20.

In some embodiments, each sub-pixel P further includes at least one light output device for emitting light 22, and the at least one light output device 22 may be disposed in the array substrate 10 or the color film substrate 20. The array substrate 10 or the color film substrate 20 further includes at least one reflecting device each for providing reflected light to one or more corresponding light output devices 22. The functions and arrangements of the light output device 22 and of the reflecting device will be specifically described in the subsequent embodiments.

It may be understood that, the color of light emitted by the light output device in the sub-pixel of the first color is the first color, the color of light emitted by the light output device in the sub-pixel of the second color is the second color, and the color of light emitted by the light output device in the sub-pixel of the third color is the third color.

Figure 3:
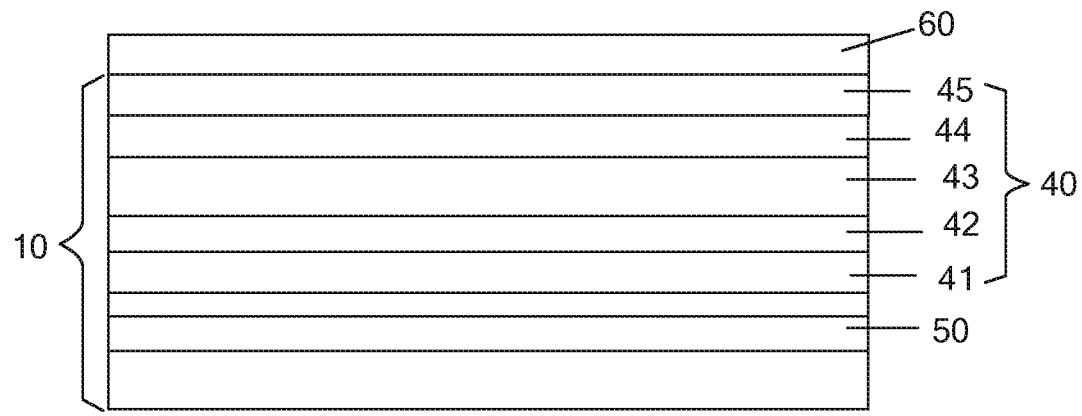
FIG. 3 is a schematic sectional view of a structure of another display panel, according to some embodiments of the present disclosure.

In some embodiments, the display panel is a self-luminescence display panel. As shown in FIG. 3, the self-luminescence display panel includes an array substrate 10 and an encapsulation structure 60. For example, the encapsulation structure 60 includes a thin film encapsulation layer; or, the encapsulation structure 60 includes a rigid substrate.

As shown in FIG. 3, in the self-luminescence display panel, each sub-pixel P includes a pixel driving circuit 50 and a light-emitting device 40 corresponding to each sub-pixel P. The pixel driving circuit 50 includes electronic devices such as at least one TFT and at least one capacitor (C, for short).

For example, the pixel driving circuit 50 may have a 2T1C structure. That is, the pixel driving circuit 50 includes two TFTs and one capacitor. The two TFTs include one switching TFT and one driving TFT.

Of course, it may be understood that the pixel driving circuit 50 may have another structure other than 2T1C. For example, the pixel driving circuit 50 may include more than two TFTs and at least one capacitor. The more than two TFTs may include, for example, a plurality of switching TFTs and one driving TFT.

The light-emitting device 40 includes a cathode 45, an anode 41, and a light-emitting functional layer disposed between the cathode 45 and the anode 41.

For example, as shown in FIG. 3, taking the light-emitting device being an organic light-emitting diode (OLED) as an example, the light-emitting functional layer may include an organic light-emitting layer 43, a hole transport layer 42 disposed between the organic light-emitting layer 43 and the anode 41, and an electron transport layer 44 disposed between the organic light-emitting layer 43 and the cathode 45.

In some examples, the light-emitting functional layer may further include a hole injection layer disposed between the hole transport layer 42 and the anode 41.

In some examples, the light-emitting functional layer may further include an electron injection layer disposed between the electron transport layer 44 and the cathode 45.

It should be noted that FIG. 3 exemplarily shows only the structure diagram of the self-luminescence display panel, not the electrical connection of the pixel driving circuit 50 to the light-emitting device 40. The electrical connection of the pixel driving circuit 50 to the light-emitting device 40 is not limited in the embodiments of the present disclosure, and any suitable electrical connection of the pixel driving circuit 50 to the light-emitting device 40 may be used according to the structure of the pixel driving circuit 50.

In some embodiments, each sub-pixel P further includes at least one light output device for emitting light, and the at least one light output device may be disposed in the array substrate 10 or the color film substrate 20. The array substrate 10 or the color film substrate 20 further includes at least one reflecting device each for providing reflected light to one or more corresponding light output devices. The functions and arrangements of the light output device and of the reflecting device will be specifically described in the subsequent embodiments.

On this basis, some embodiments of the present disclosure provide a display substrate may be applied to any one of the array substrate 10, the color film substrate 20 or the encapsulation structure 60.

As shown in FIGS. 4A to 19, the display substrate includes a base 21, and at least light output device 22 and at least one reflecting device 23 that are disposed above the base 21.

Each reflecting device 23 is configured to reflect incident light that is incident to the reflecting device 23 in a direction perpendicular to the base into one or more light output devices disposed on a side of the reflecting device. Each light output device 22 is configured to emit display light in response to the received incident light.

It may be understood that, the display light emitted by one light output device 22 is light having one corresponding color. In some examples, the light output device 22 and the reflecting device 23 are directly disposed on a surface of the base 21. In other examples, the display substrate further includes other layers disposed between the base 21 and both the light output device 22 and the reflecting device 23, for example, a TFT array layer including a plurality of TFTs, insulating layers, etc., which will not be limited in the embodiments of the present disclosure.

The at least one light output device 22 and the at least one reflecting device 23 are disposed adjacent to each other.

In some embodiments, as shown in FIGS. 4A to 4D, the at least one light output device 22 includes a plurality of light output devices 22 arranged in an array, and the at least one reflecting device 23 includes a plurality of reflecting devices 23 arranged in an array.

Figure 4A:
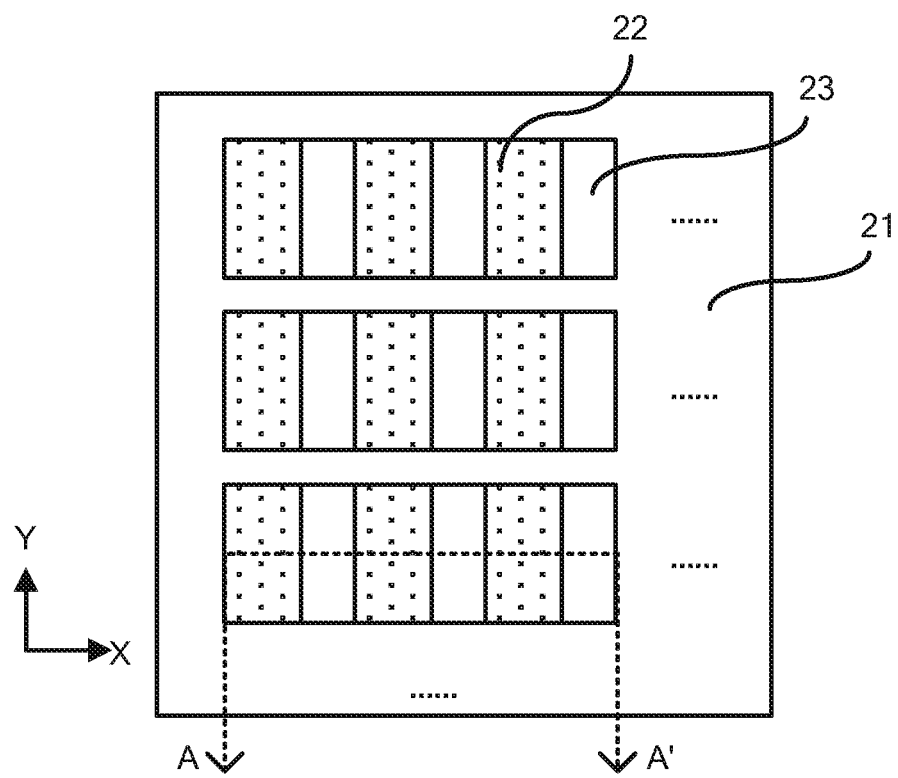
FIG. 4A is a schematic top view of a structure of a display substrate, according to some embodiments of the present disclosure.

For example, as shown in FIG. 4A, in a row direction X, at least one light output device 22 and at least one reflecting device 23 are disposed adjacent to each other.

Figure 4B:
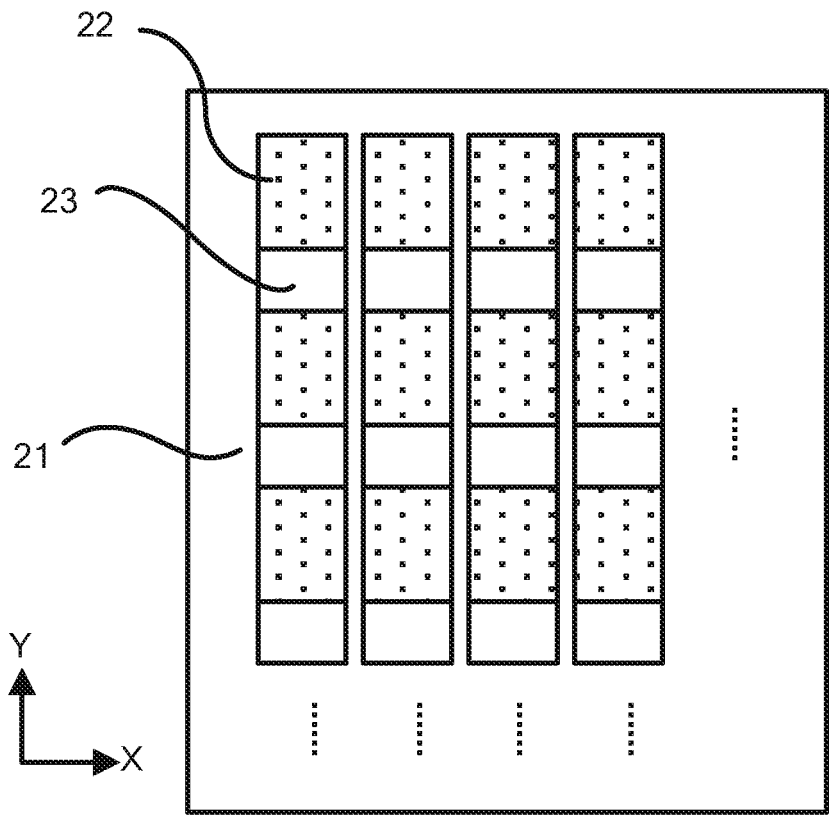
FIG. 4B is a schematic top view of a structure of another display substrate, according to some embodiments of the present disclosure.
Figure 4C:
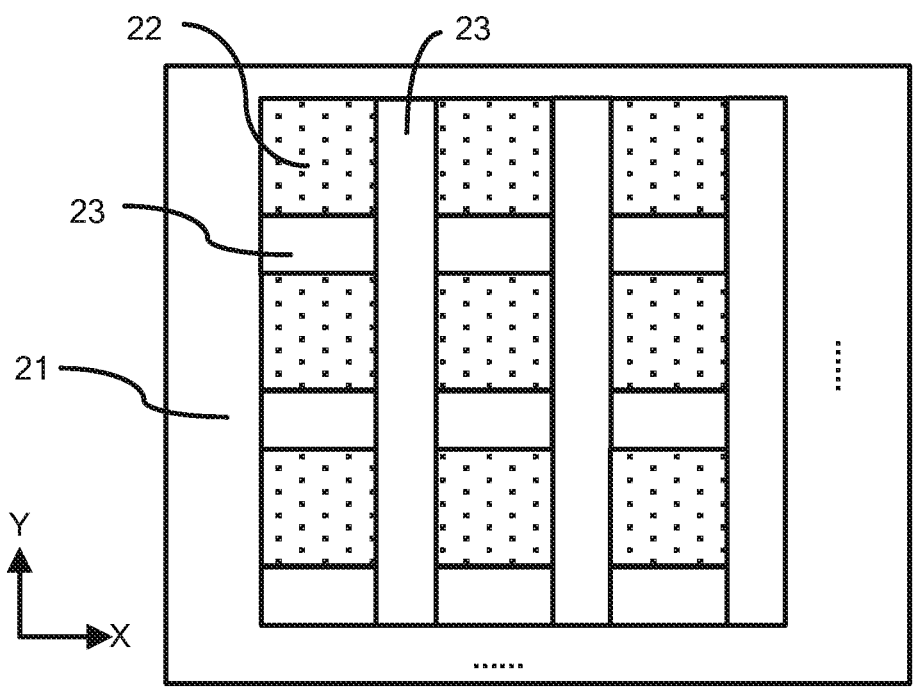
FIG. 4C is a schematic top view of a structure of yet another display substrate, according to some embodiments of the present disclosure.
Figure 4D:
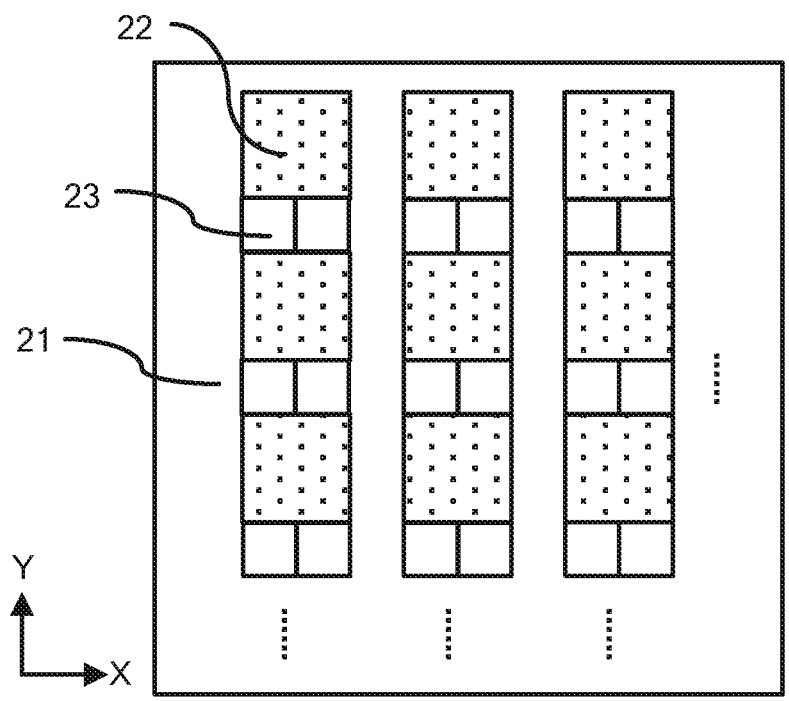
FIG. 4D is a schematic top view of a structure of yet another display substrate, according to some embodiments of the present disclosure.

For example, as shown in FIGS. 4B and 4D, in a column direction Y, at least one light output device 22 and at least one reflecting device 23 are disposed adjacent to each other.

For example, as shown in FIG. 4C, in the row direction X, at least one light output device and at least one reflecting device are disposed adjacent to each other, and in the column direction Y, at least one light output device and at least one reflecting device are disposed adjacent to each other.

It may be understood that, the adjacent arrangement of the light output devices and the reflecting devices as shown in FIGS. 4A to 4D is merely exemplary, and there may be different adjacent arrangements (i.e., correspondences) of the light output devices 22 and the reflecting devices 23.

For example, one light output device 22 may correspond to one reflecting device 23. As shown in FIG. 4A, one corresponding reflecting device 23 may be disposed on a side of each light output device 22 in the row direction X; or, as shown in FIG. 4B, one corresponding reflecting device 23 may be disposed on a side of each light output device 22 in the column direction Y.

For example, a plurality of light output devices 22 may correspond to one reflecting device 23. As shown in FIG. 4C, one reflecting device 23 is disposed on a side of each column of a plurality of light output devices 22.

For example, one light output device 22 may correspond to a plurality of reflecting devices 23. As shown in FIG. 4D, a plurality of reflecting devices 23 may be disposed on a side of each light output device 22.

Furthermore, on this basis, as shown in FIG. 4A, in the row direction X, one reflecting device 23 is disposed between two adjacent light output devices 22; as shown in FIG. 4B, in the column direction Y, one reflecting device 23 is disposed between two adjacent light output devices 22; as shown in FIG. 4C, in the row direction X, one reflecting device 23 is disposed between two adjacent light output devices 22, and in the column direction Y, one reflecting device 23 is disposed between two adjacent light output devices 22; and as shown in FIG. 4D, in the column direction Y, one reflecting device 23 is disposed between two adjacent light output devices 22. Thus, on the basis that each light output device 22 receives the reflected incident light from corresponding one or more reflecting devices 23 to emit display light, adjacent light output devices 22 may further be spaced from each other by the reflecting device 23 disposed therebetween, thereby effectively avoiding the mixture of display light emergent by the adjacent light output devices 22.

Figure 5A:
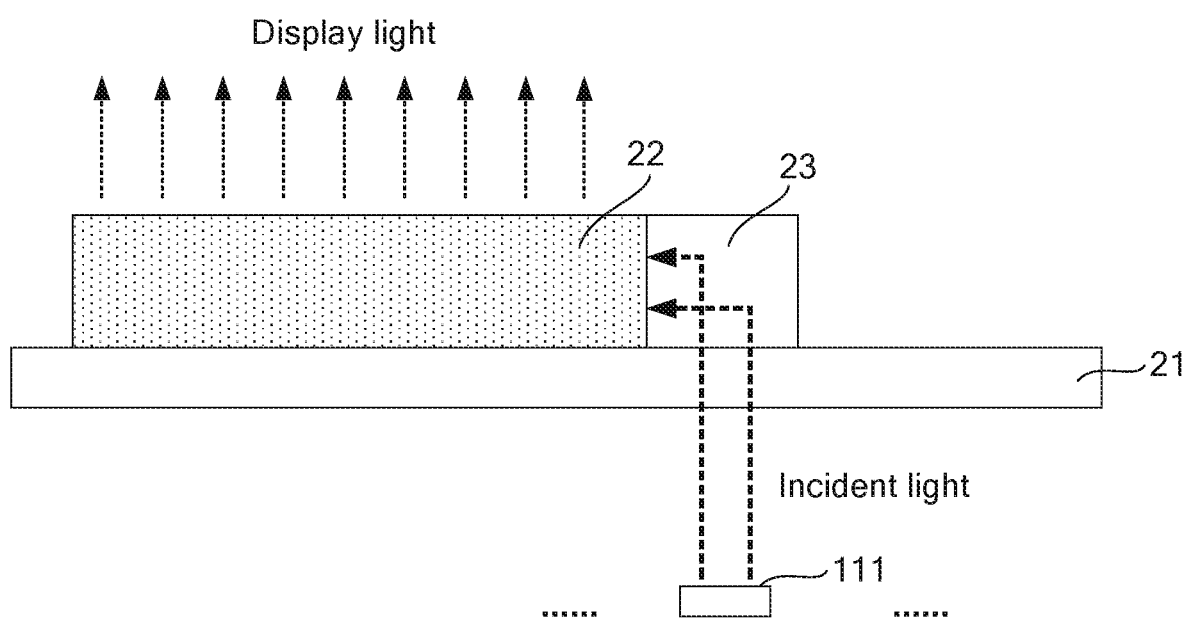
FIG. 5A is a schematic diagram showing a light exit mode of a light output device, according to some embodiments of the present disclosure.
Figure 5B:
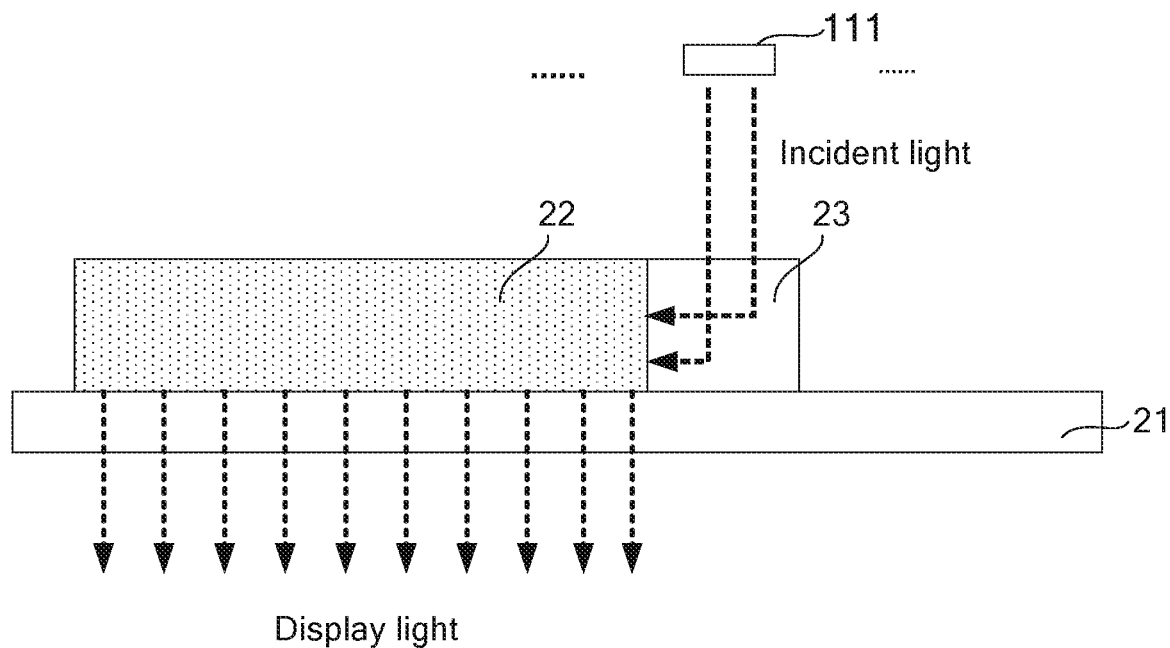
FIG. 5B is a schematic diagram showing another light exit mode of a light output device, according to some embodiments of the present disclosure.

As shown in FIGS. 5A and 5B, an exit direction of the display light from the light output device 22 is the same as an entrance direction of the incident light.

In some embodiments, the display light emitted by the light output device 22 is emergent to a direction facing away from the base 21, that is, not pass through the base 21. In this case, the light output device 22 may be called a top-emitting output device. Accordingly, as shown in FIG. 5A, the incident light is incident to the reflecting device 23 after passing through the base 21 in a direction perpendicular or approximately perpendicular to the base 21, and then reflected by the reflecting device 23 into the corresponding light output device 22.

In some other embodiments, the display light emitted by the light output device 22 is emergent after passing through the base 21. In this case, the light output device 22 may be called a bottom-emitting output device. Accordingly, as shown in FIG. 5B, the incident light is incident to the reflecting device 23 without passing through the base 21 in a direction perpendicular or approximately perpendicular to the base 21, and then reflected by the reflecting device 23 into the corresponding light output device 22.

Figure 6:
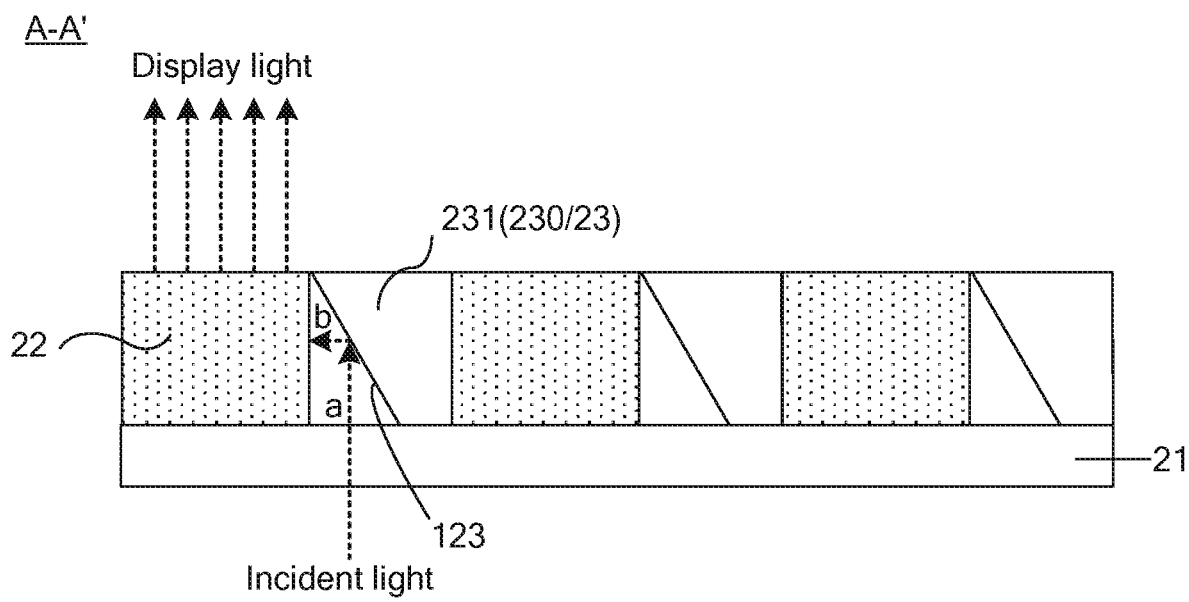
FIG. 6 is a sectional view of the display substrate in FIG. 4A along line A-A'.
Figure 7:
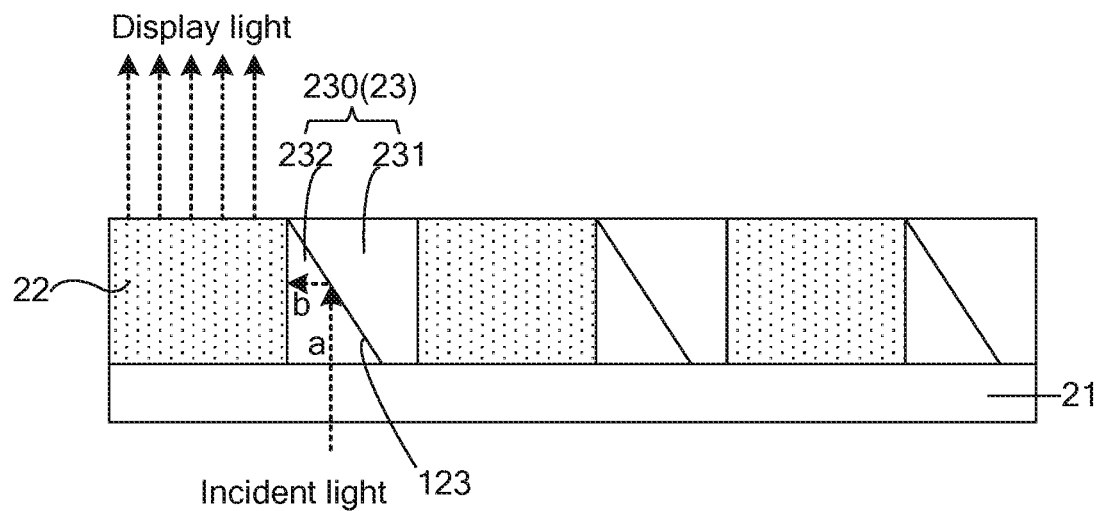
FIG. 7 is another sectional view of the display substrate in FIG. 4A along line A-A'.
Figure 8:
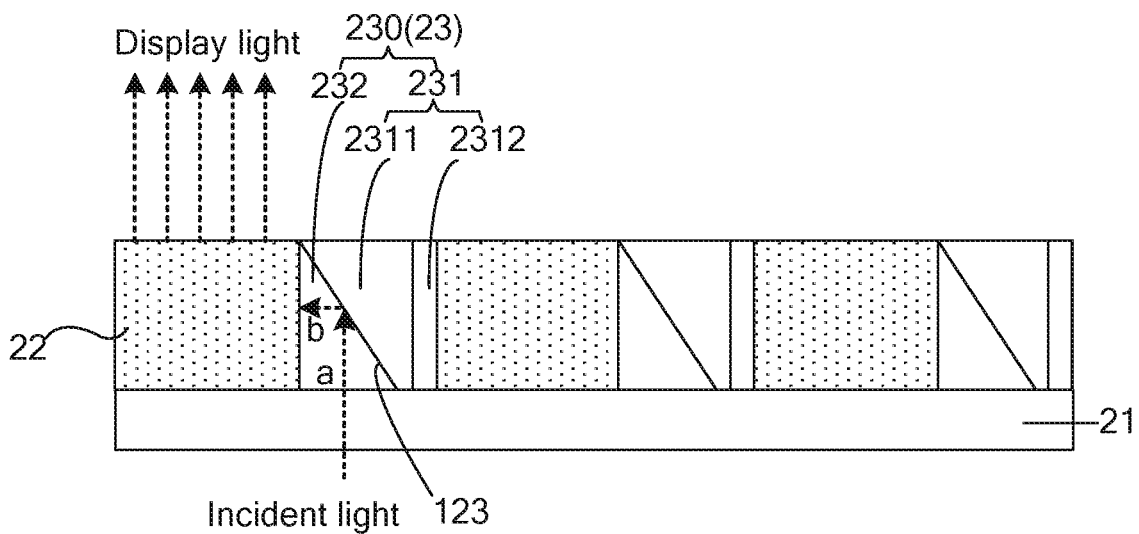
FIG. 8 is yet another sectional view of the display substrate in FIG. 4A along line A-A'.
Figure 9:
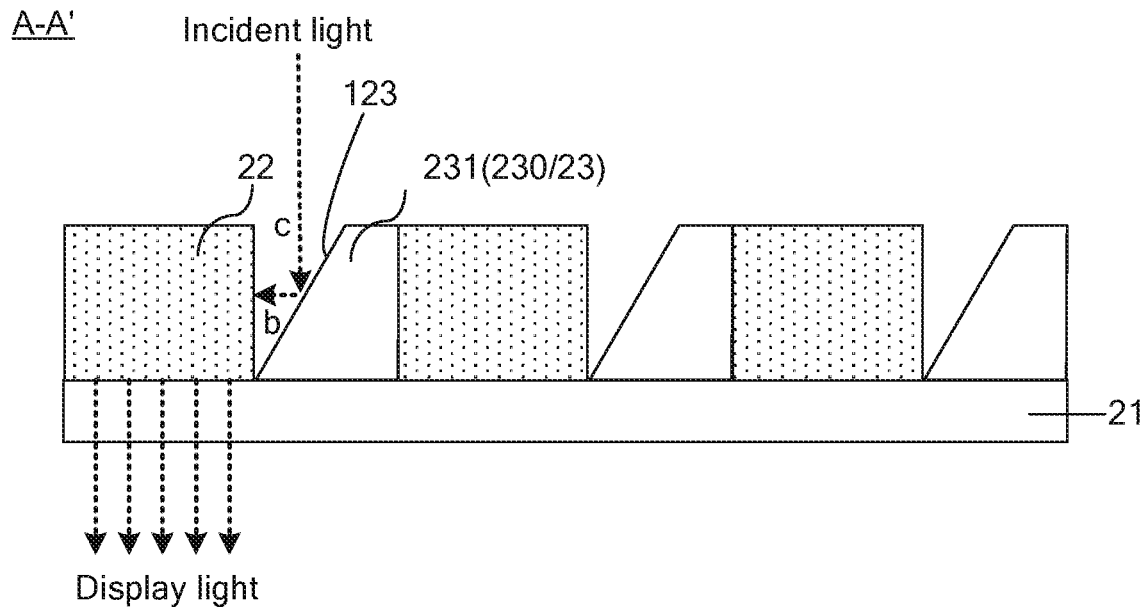
FIG. 9 is yet another sectional view of the display substrate in FIG. 4A along line A-A'.
Figure 10:
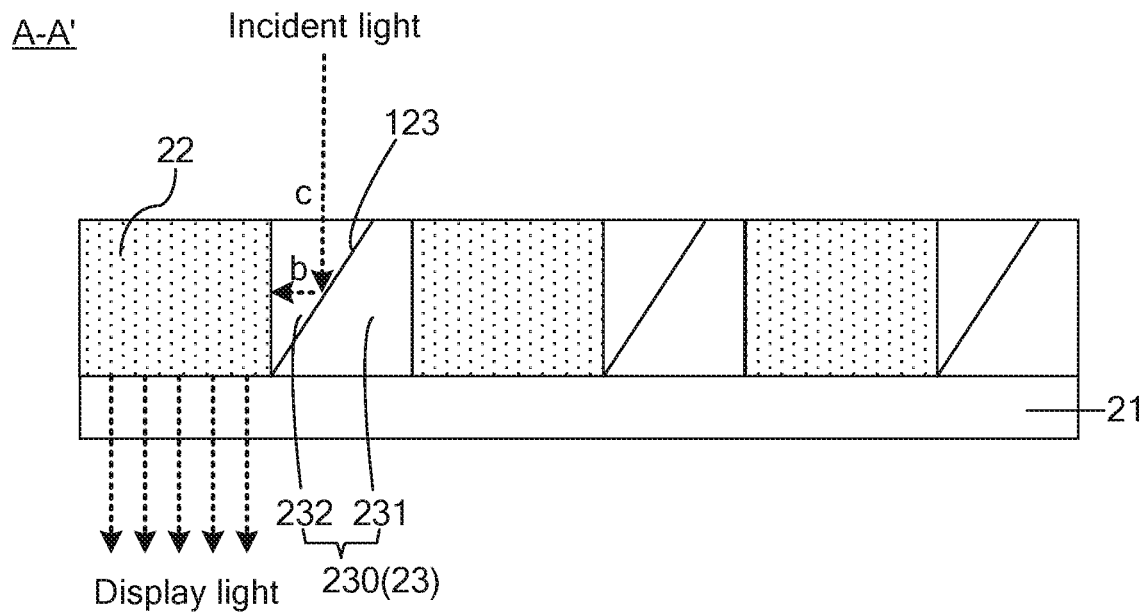
FIG. 10 is yet another sectional view of the display substrate in FIG. 4A along line A-A'.
Figure 11:
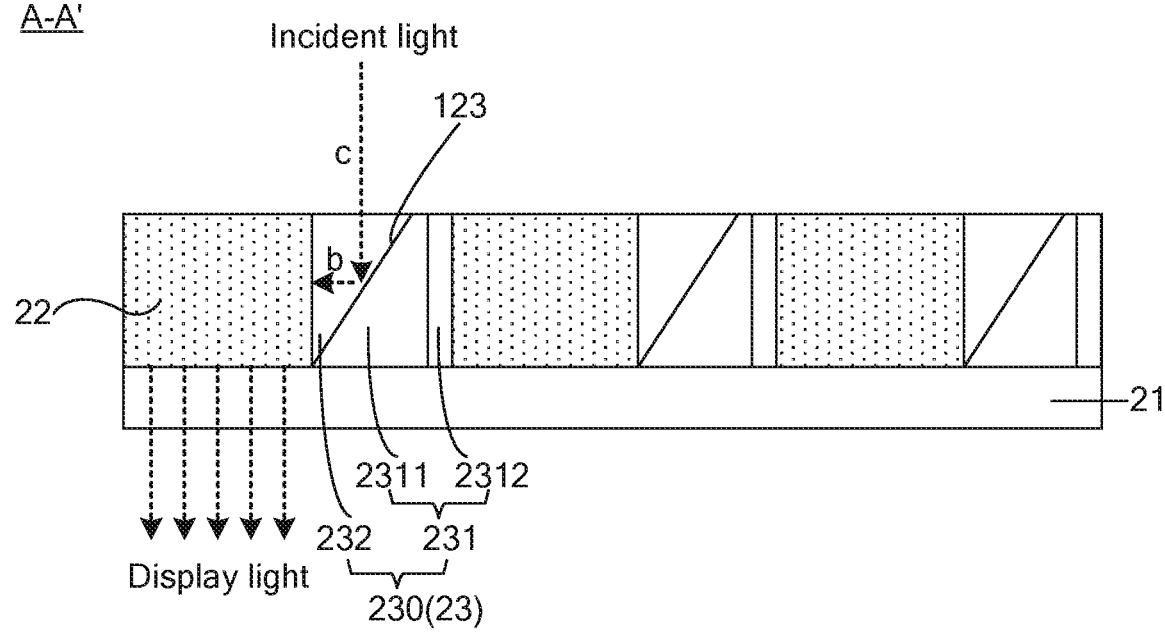
FIG. 11 is yet another sectional view of the display substrate in FIG. 4A along line A-A'.

The structure of the reflecting device 23 may refer to FIGS. 6 to 11. As shown in FIGS. 6 to 8, the display light emitted by the light output device 22 is emergent to the direction facing away from the base 21, and as shown in FIGS. 9 to 11, the display light emitted by the light output device 22 is emergent after passing through the base 21.

As shown in FIGS. 6 to 11, the reflecting device 23 includes a first reflecting surface 123 inclined with respect to the base 21. The first reflecting surface 123 is configured to reflect the incident light that is incident to the first reflecting surface 123 into one or more light output devices 22 disposed on a side of the first reflecting surface 123.

In this way, after being reflected, the incident light can enter the light output device 22 from a side face of the light output device 22 so as to be in contact with a light output layer (e.g., a quantum dot light-emitting layer or a diffuse reflecting layer) in the light output device 22 adequately, thus the utilization of the incident light may be increased. Here, the side face of the light output device 22 is a surface of the light output device 22 that is perpendicular or approximately perpendicular to the base 21.

The angle at which the first reflecting surface 123 is inclined with respect to the base 21 may be set correspondingly by a person skilled in the art according to the propagation direction of the incident light, as long as the incident light can be, after being reflected by the first reflecting surface 123, incident into the light output device 22 from a side face of the light output device 22.

In some embodiments, to ensure that the incident light that is incident to the first reflecting surface 123 can be, after being reflected by the first reflecting surface 123, incident into the light output device 22 in a direction parallel or approximately parallel to the base 21 so as to further increase the utilization of the incident light, an included angle between the first reflecting surface 123 and the base 21 may be within a range of 42° to 48°, inclusive, for example, 42°, 45° or 48°.

It should be noted that, in a case where the reflecting device 23 is directly disposed on the surface of the base, the included angle is an included angle between the first reflecting surface 123 and the surface of the base 21; and in a case where another film layer is also disposed on the base 21 and the reflecting device 23 is disposed on a surface of the another film layer facing away from the base 21, the included angle is an included angle between the first reflecting surface 123 and a surface of the base 21 that is in contact with the another film layer.

As shown in FIGS. 6 and 9, the reflecting device 23 includes a reflecting structure 230, and the reflecting structure 230 includes a first structure 231. Or, as shown in FIGS. 7, 8, 10 and 11, the reflecting device 23 includes a reflecting structure 230, the reflecting structure 230 includes a first structure 231 and a second structure 232.

In some embodiments, as shown in FIGS. 6 and 9, the reflecting structure 230 includes only a first structure 231. That is to say, the reflecting structure 230 is the first structure 231. The first structure 231 is made of a reflecting material, and the first reflecting surface 123 is an inclined side face of the first structure 231.

Depending upon the exit direction of the light output device 22, the way of inclining the first reflecting surface 123 with respect to the base 21 varies.

In some embodiments, as shown in FIG. 6, a side of the first reflecting surface 123 away from the base 21 is closer to the light output device 22 that the first reflecting surface 123 faces, than a side of the first reflecting surface 123 proximate to the base 21. In this case, the incident light is incident to the first reflecting surface 123 in the direction perpendicular or approximately perpendicular to the base 21 (i.e., the direction indicated by the dotted arrow a in FIG. 6) after passing through the base 21, and then into the light output device 22 in the direction parallel or approximately parallel to the base 21 (i.e., the direction indicated by the dotted arrow b in FIG. 6) after being reflected by the first reflecting surface 123. In this way, the display light emitted by the light output device 22 is emergent toward the direction facing away from the base 21.

In some other embodiments, as shown in FIG. 9, a side of the first reflecting surface 123 proximate to the base 21 is closer to the light output device 22 that the first reflecting surface 123 faces, than a side of the first reflecting surface 123 away from the base 21. In this case, the incident light is incident to the first reflecting surface 123 in the direction perpendicular or approximately perpendicular to the base 21 (i.e., the direction indicated by the dotted arrow c in FIG. 9) without passing through the base, and then into the light output device 22 in the direction parallel or approximately parallel to the base 21 (i.e., the direction indicated by the dotted arrow b in FIG. 9) after being reflected by the first reflecting surface 123. In this way, the display light emitted by the light output device 22 is emergent after passing through the base 21.

In some embodiments, as shown in FIGS. 7, 8, 10 and 11, the reflecting structure 230 includes a first structure 231 made of a reflecting material and a second structure 232 made of a light-transmitting material. In this case, the first reflecting surface 123 is an inclined side face of the first structure 231.

For example, the reflecting material may be a metal material, such as Ag or Al, with high reflectivity, to improve the efficiency of light reflection. For example, the light-transmitting material may be transparent resin.

For example, as shown in FIGS. 7 and 10, the second structure 232 is disposed on a side of the first reflecting surface 123 facing the one or more light output devices 22 disposed on a side of the first reflecting surface 123. That is to say, the second structure 232 is closer to the one or more light output devices 22 disposed on the side of the reflecting device 23 than the first structure 231.

In some embodiments, as shown in FIG. 7, a side of the first reflecting surface 123 away from the base 21 is closer to the light output device 22 that the first reflecting surface 123 faces, than a side of the first reflecting surface 123 proximate to the base 21. In this case, the incident light is incident to the second structure 232 in the direction perpendicular or approximately perpendicular to the base 21 (i.e., the direction indicated by the dotted arrow a in FIG. 7) after passing through the base 21, then to the first reflecting surface 123 of the first structure 231 after passing through the second structure 232, and then into the light output device 22 in the direction parallel or approximately parallel to the base 21 (i.e., the direction indicated by the dotted arrow b in FIG. 7) after being reflected by the first reflecting surface 123. In this way, the display light emitted by the light output device 22 is emergent toward the direction facing away from the base 21.

In some other embodiments, as shown in FIG. 10, a side of the first reflecting surface 123 proximate to the base 21 is closer to the light output device 22 that the first reflecting surface 123 faces, than a side of the first reflecting surface 123 away from the base 21. In this case, the incident light is incident to the second structure 232 in the direction perpendicular or approximately perpendicular to the base 21 (i.e., the direction indicated by the dotted arrow c in FIG. 10) without passing through the base 21, then to the first reflecting surface 123 of the first structure 231 after passing through the second structure 232, and then into the light output device 22 in the direction parallel or approximately parallel to the base 21 (i.e., the direction indicated by the dotted arrow b in FIG. 10) after being reflected by the first reflecting surface 123. In this way, the display light emitted by the light output device 22 is emergent after passing through the base 21.

In some embodiments, as shown in FIGS. 8 and 11, the reflecting structure 230 includes a first structure 231 and a second structure 232. The first structure 231 includes a transmission sub-portion 2311 made of a first light-transmitting material. The second structure 232 is made of a second light-transmitting material and in contact with the transmission sub-portion 2311. A refractive index of the first light-transmitting material is less than a refractive index of the second light-transmitting material. In this case, the first reflecting surface 123 is an inclined side face of the second structure 232. The second structure 232 is closer to the one or more light output devices 22 disposed on the side of the reflecting device 23 than the first structure 231.

It may be known from the forgoing description that the first light-transmitting material for forming the transmission sub-portion 2311 has a refractive index less than that of the second light-transmitting material for forming the second structure 232. In this way, when an angle at which the incident light is incident to a surface of the second structure 232 (i.e., optically denser medium) in contact with the transmission sub-portion 2311 (i.e., optically thinner medium) is greater than a critical angle C, the incident light will be totally reflected by this surface. As a result, the incident light is unable to be incident into the transmission sub-portion 2311 by passing through this surface. Instead, the incident light is back to the second structure 232 and then incident toward the light output device 22 proximate to this surface. That is to say, the surface of the second structure 232 in contact with the transmission sub-portion 2311 forms the first reflecting surface 123 of the reflecting device 23.

It should be understood that the critical angle C meets the following formula: sin C=n2/n1, where n1 represents a refractive index of a optically denser medium (e.g., the second structure 232 in the above embodiments), and n2 represents a refractive index of a optically thinner medium (e.g., the transmission sub-portion 2311 in the above embodiments). In this case, the critical angle C may be determined by a person skilled in the art according to the angle at which the incident light is incident to the first reflecting surface 123, so that the angle of incidence and the critical angle C meet the following condition: the angle of incidence is greater than the critical angle C; and then suitable first light-transmitting material and second light-transmitting material are selected according to the determined critical angle C, so that the refractive index (n2) of the first light-transmitting material and the refractive index (n1) of the second light-transmitting material meet the above formula, in order to ensure that a total reflection may occur on the surface of the second structure 232 in contact with the transmission sub-portion 2311.

In some embodiments, as shown in FIG. 8, a side of the first reflecting surface 123 away from the base 21 is closer to the light output device 22 than a side of the first reflecting surface 123 proximate to the base 21. In this case, the incident light is incident to the second structure 232 in the direction perpendicular or approximately perpendicular to the base 21 after passing through the base 21, then to the first reflecting surface 123 of the second structure 232, and then into the light output device 22 in the direction parallel or approximately parallel to the base 21 (i.e., the direction indicated by the dotted arrow b in FIG. 8) after being reflected by the first reflecting surface 123. In this way, the display light emitted by the light output device 22 is emergent toward the direction facing away from the base 21.

In some embodiments, as shown in FIG. 11, a side of the first reflecting surface 123 proximate to the base 21 is closer to the light output device 22 than a side of the first reflecting surface 123 away from the base 21. In this case, the incident light is incident to the second structure 232 in the direction perpendicular or approximately perpendicular to the base 21 without passing through the base 21, then to the first reflecting surface 123 of the second structure 232, and then into the light output device 22 in the direction parallel or approximately parallel to the base 21 (i.e., the direction indicated by the dotted arrow b in FIG. 11) after being reflected by the first reflecting surface 123. In this way, the display light emitted by the light output device 22 is emergent after passing through the base 21.

Figure 12:
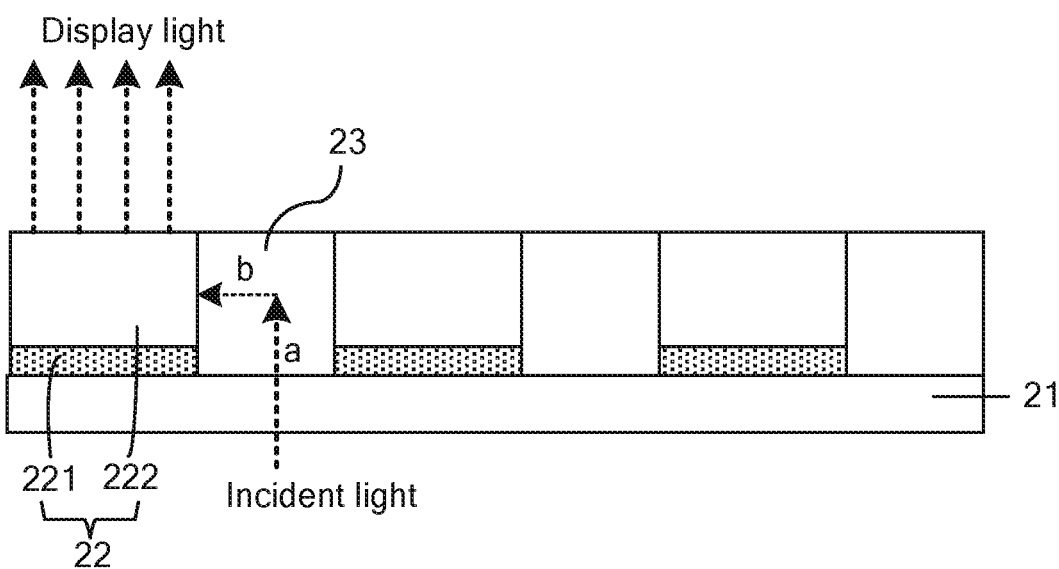
FIG. 12 is yet another sectional view of the display substrate in FIG. 4A along line A-A'.
Figure 13:
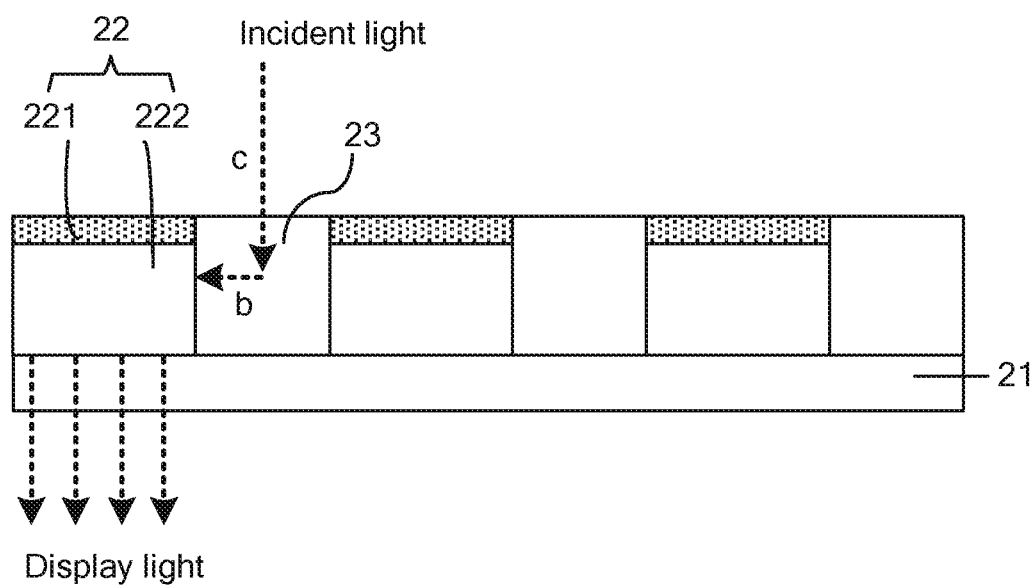
FIG. 13 is yet another sectional view of the display substrate in FIG. 4A along line A-A'.

The structure of the light output device 22 may refer to FIGS. 12 and 13. The display light emitted by the light output device 22 as shown in FIG. 12 is emergent toward the direction facing away from the base 21, and the display light emitted by the light output device 22 as shown in FIG. 13 is emergent after passing through the base 21.

As shown in FIGS. 12 and 13, the light output device 22 includes a second light-shielding layer 221 and a light output layer 222, which are stacked successively in the exit direction of the display light, and an orthographic projection of the light output layer 222 on the base 21 is within an orthographic projection of the second light-shielding layer 221 of a same light output device 22 on the base 21.

The light output layer 222 may be a quantum dot light-emitting layer made of a quantum dot material, or the light output layer 222 may be a diffuse reflecting layer including a plurality of diffusion particles.

In a case where the light output layer 222 is a quantum dot light-emitting layer, the light output device 22 is a light conversion device. The incident light, after being incident to the quantum dot light-emitting layer in the light conversion device, excites the quantum dots in the quantum dot light-emitting layer to emit the display light.

Here, it should be noted that, when the incident light is incident to the quantum dot light-emitting layer of the light conversion device, the quantum dots in the quantum dot light-emitting layer absorb energy of photons in the incident light and release this energy in form of light energy (i.e., emitting light) and heat energy. However, since part of the energy of photons absorbed by the quantum dots is released in the form of heat energy, the energy of photons of the incident light should be greater than the energy of photons of display light excited by the incident light.

According to the formula for the energy of the photon: $E=hc/\lambda$ (where E represents the energy of the photon, h represents the Planck constant, c represents the velocity of light, and $\lambda$ represents the wavelength), the energy of the photon increases as the wavelength of light decreases. In other words, the less the wavelength of light is, the higher the energy of the photon is. Thus, the wavelength of the incident light is less than that of the display light excited by the incident light. That is, the display light emitted by the light conversion device and the incident light are different in color.

In a case where the light output layer 222 is a diffuse reflecting layer, the light output device 22 is a light reflecting device. The incident light, after being incident to the diffuse reflecting layer in the light reflecting device, is reflected out of this light reflecting device by the plurality of diffusion particles in the diffuse reflecting layer, so that the light reflecting device emits the display light. Thus, the wavelength of the display light emitted by the light reflecting device is the same as the wavelength of the incident light. That is, the display light emitted by the light reflecting device and the incident light are the same in color.

In some examples, as shown in FIG. 12, the display light is emergent toward the direction facing away from the base 21, the second light-shielding layer 221 and the light output layer 222 are stacked successively above the base 21, and the second light-shielding layer 221 is configured to block the emergence of light, which is incident to the second light-shielding layer 221, from a side of the light output layer 222 facing the base 21.

It should be understood that, the light blocked by the second light-shielding layer 221 is, for example, part of the incident light that is incident into the light output layer 222 but not effectively utilized by the light output layer 222, for example: in a case where the light output layer 222 is a quantum dot light-emitting layer, light that is incident into gaps between the quantum dots in the quantum dot light-emitting layer, or in a case where the light output layer 222 is a diffuse reflecting layer, light that is incident into gaps between the diffusion particles in the diffuse reflecting layer; the light blocked by the second light-shielding layer 221 is, for another example, light emitted toward the base 21 by the quantum dots in the quantum dot light-emitting layer after being excited by the incident light, or the light blocked by the second light-shielding layer 221 is light emitted toward the base 21 after being reflected by the diffusion particles in the diffuse reflecting layer.

In some other examples, as shown in FIG. 13, the display light is emergent after passing through the base 21, the light output layer 222 and the second light-shielding layer 221 are stacked successively above the base 21, and the second light-shielding layer 221 is configured to prevent light incident to the second light-shielding layer 221 from being emergent from a side of the light output layer 222 facing away from the base 21.

It should be understood that, the light blocked by the second light-shielding layer 221 is, for example, part of the incident light that is incident into the light output layer 222 but not effectively utilized by the light output layer 222, for example: in a case where the light output layer 222 is a quantum dot light-emitting layer, light that is incident into gaps between the quantum dots in the quantum dot light-emitting layer, or in a case where the light output layer 222 is a diffuse reflecting layer, light that is incident into gaps between the diffusion particles in the diffuse reflecting layer; the light blocked by the second light-shielding layer 221 is, for another example, light emitted in a direction facing away from the base 21 by the quantum dots in the quantum dot light-emitting layer after being excited by the incident light, or the light blocked by the second light-shielding layer 221 is light emitted in the direction facing away from the base 21 after being reflected by the diffusion particles in the diffuse reflecting layer.

In some examples, the second light-shielding layer 221 may be made of a material having high reflectivity to light, for example, a metal material such as Ag or Al, to further increase the utilization of the incident light that is incident into the light output layer 222, or to increase the light exit rate of the display light emitted by the light output layer 222, or to increase both the utilization and the light exit rate. The specific description will not be repeated here.

In some other examples, the second light-shielding layer 221 may be made of an opaque material, for example black resin material, to shield the light.

In the case where the light output device 22 is the light conversion device, the quantum dot light-emitting layer in each light conversion device may be any one of a quantum dot light-emitting layer of a first color, a quantum dot light-emitting layer of a second color, and a quantum dot light-emitting layer of a third color. The first color, the second color and the third color are three primary colors. For example, the first color, the second color and the third color may be red, green and blue, respectively.

The quantum dot is, for example, CdSe or CdS.

Since the color of light emitted by the quantum dot depends upon the diameter of the quantum dot, quantum dot in the quantum dot light-emitting layer of the first color, quantum dot in the quantum dot light-emitting layer of the second color, and quantum dot in the quantum dot light-emitting layer of the third color are different in diameter.

For example, the quantum dot light-emitting layer of the first color, the quantum dot light-emitting layer of the second color, and the quantum dot light-emitting layer of the third color are a red quantum dot light-emitting layer, a green quantum dot light-emitting layer and a blue quantum dot light-emitting layer, respectively, the quantum dots in the red quantum dot light-emitting layer may have a diameter of 2.4 nm, the quantum dots in the green quantum dot light-emitting layer may have a diameter of 1.7 nm, and the quantum dots in the blue quantum dot light-emitting layer may have a diameter of 1.0 nm.

Figure 14:
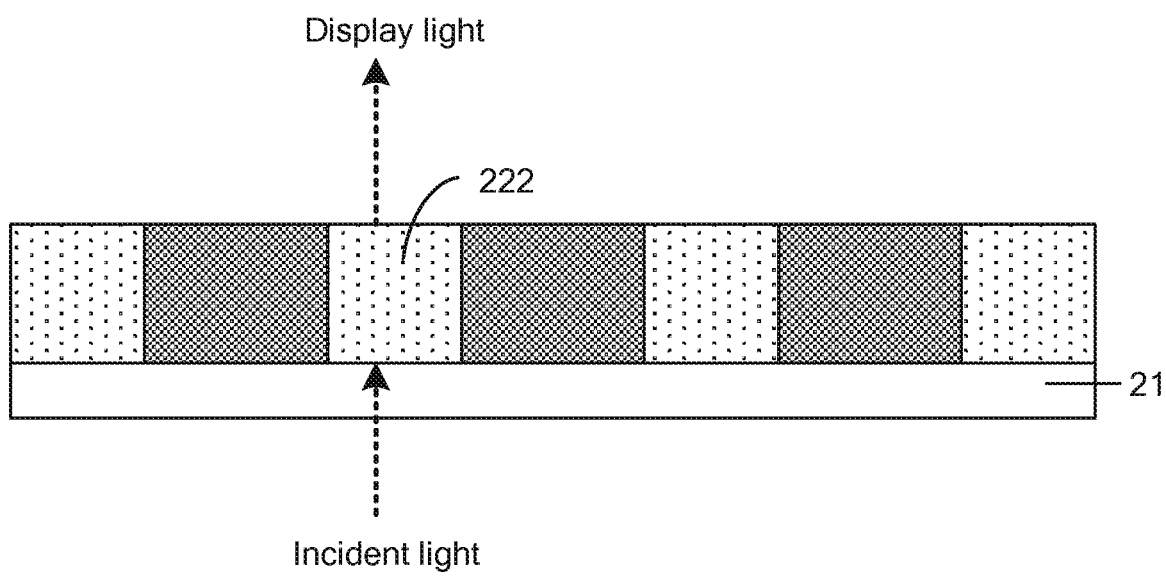
FIG. 14 is a schematic diagram showing a structure of a display substrate in the related art.

As shown in FIG. 14, in the related art, a side of the quantum dot light-emitting layer 222 that receives the incident light is opposite to a side of the quantum dot light-emitting layer 222 that emits the display light. That is, the incident light is incident in a thickness direction of the quantum dot light-emitting layer 222. In this case, in the direction perpendicular to the base, in a case where the quantum dot light-emitting layer 222 has a small thickness, it is easy for part of the incident light to directly pass through the quantum dot light-emitting layer 222. Since the incident light and the display light emitted by the quantum dot light-emitting layer 222 are different in color, this problem will cause the side of the quantum dot light-emitting layer 222 that emits the display light to emit both the display light and the incident light (of two colors). As a result, the display effect is influenced.

In the related art, to prevent part of the incident light from directly passing through the quantum dot light-emitting layer due to a small thickness of the quantum dot light-emitting layer, the quantum dot light-emitting layer is usually made to have a large thickness, resulting in large overall thickness of the display substrate and more use of quantum dot materials and thus high production cost.

Thus, in the display substrate of the embodiments of the present disclosure, at least one reflecting device 23 in adjacent to the light output device 22 is provided to change the propagation direction of the incident light, so that the incident light reflected by the reflecting device 23 is incident to the light output layer 222 in the light output device 22 in the direction parallel or approximately parallel to the substrate 21, that is, the reflected incident light is incident to the light output device 22 from the surface of the light output device 22. Therefore, in the embodiments of the present disclosure, the emergence of the incident light by directly passing through the light output layer 222 can be effectively avoided, without increasing the thickness of the light output layer 222. In addition, no more use of materials is required to increase the thickness of the light output layer 222 (for example, quantum dot light-emitting layer or diffuse reflecting layer). The production cost is saved.

In the display substrate, since there are gaps between the quantum dots in the quantum dot light-emitting layer or between the diffusion particles in the diffuse reflecting layer in the light output device 22, part of the incident light will pass through the gaps when the incident light is incident to the light output device 22. As a result, this part of the incident light cannot be responded by the light output device 22.

To avoid this, in some embodiments, as shown in FIGS. 16 to 19, the first structure 231 further includes a second reflecting surface 223 facing away from the first reflecting surface 123 and perpendicular to the base 21. The second reflecting surface 223 is configured to reflect light that is incident to the second reflecting surface 223 into one or more light output devices 22 disposed on a side of the second reflecting surface 223.

It should be noted that the light that is incident to the second reflecting surface 223 is incident light that is emergent from the one or more light output devices 22 disposed on the side of the second reflecting surface 223 but not responded by the light output device 22.

It is also to be noted that, since the first reflecting surface 123 and the second reflecting surface 223 in a same reflecting device 23 are opposite to each other, a side for the first reflecting surface 123 (i.e., a side that the first reflecting surface 123 faces) and a side for the second reflecting surface 223 (i.e., a side that the second reflecting surface 223 faces) in a same reflecting device 23 are also opposite to each other. Since one light output device 22 cannot be disposed both on the side for the first reflecting surface 123 and on the side for the second reflecting surface 223 in a same reflecting device, if one light output device 22 receives light reflected by a first reflecting surface 123 and a second reflecting surface 223, obviously, this first reflecting surface 123 and this second reflecting surface 223 are in different reflecting devices 23, respectively.

In this case, the at least one light output device 22 includes a plurality of light output devices 22, the at least one reflecting device 23 includes a plurality of reflecting devices 23, and one light output device 22 is disposed between two adjacent reflecting devices 23. The two reflecting devices 23 are disposed on two opposite sides of this light output device 22. The first reflecting surface 123 of one of the two reflecting devices 23 faces this light output device 22, and the second reflecting surface 223 of the other one of the two reflecting devices 23 faces this light output device 22.

Figure 15:
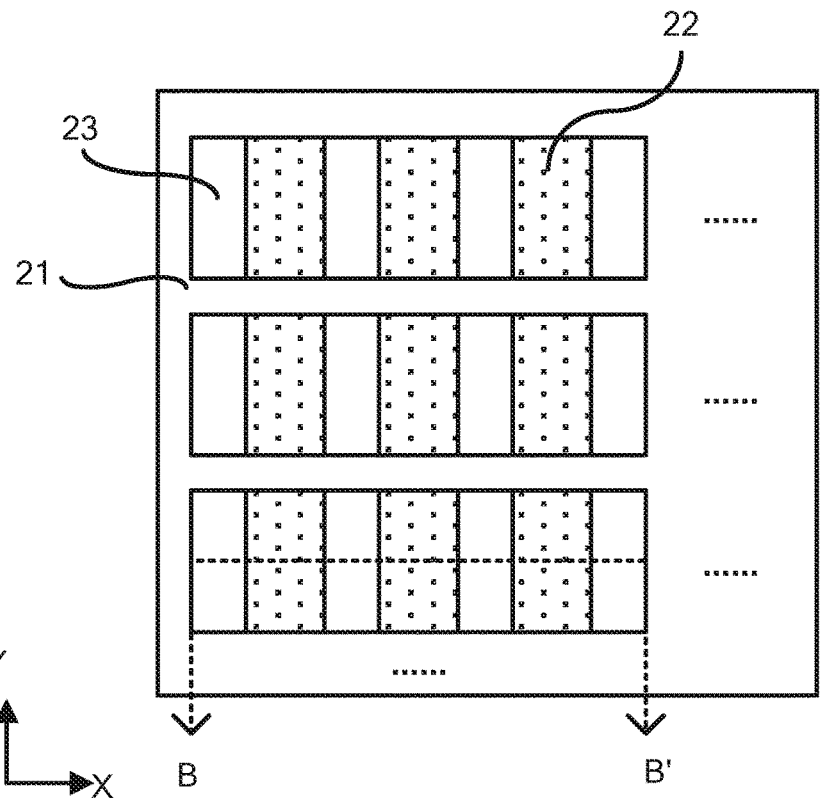
FIG. 15 is a schematic top view of a structure of yet another display substrate, according to some embodiments of the present disclosure.

For example, as shown in FIG. 15, the plurality of light output devices 22 and the plurality of reflecting devices 23 are together arranged in an array, and in the row direction X, one light output device 22 is disposed between any two adjacent reflecting devices 23.

Figure 16:
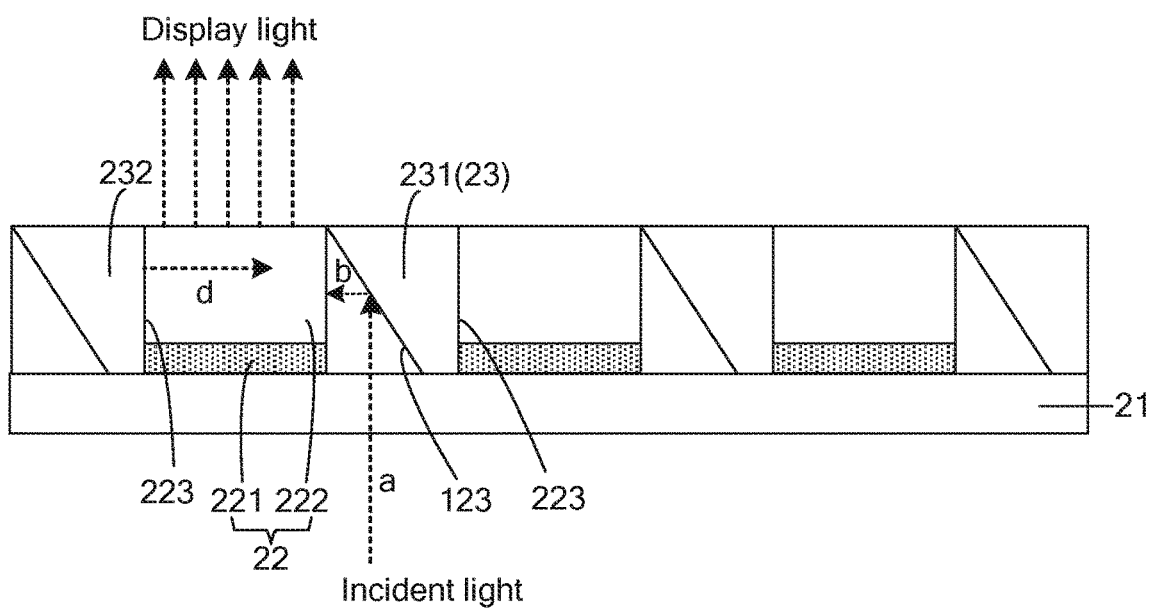
FIG. 16 is a sectional view of the display substrate in FIG. 15 along line B-B'.
Figure 17:
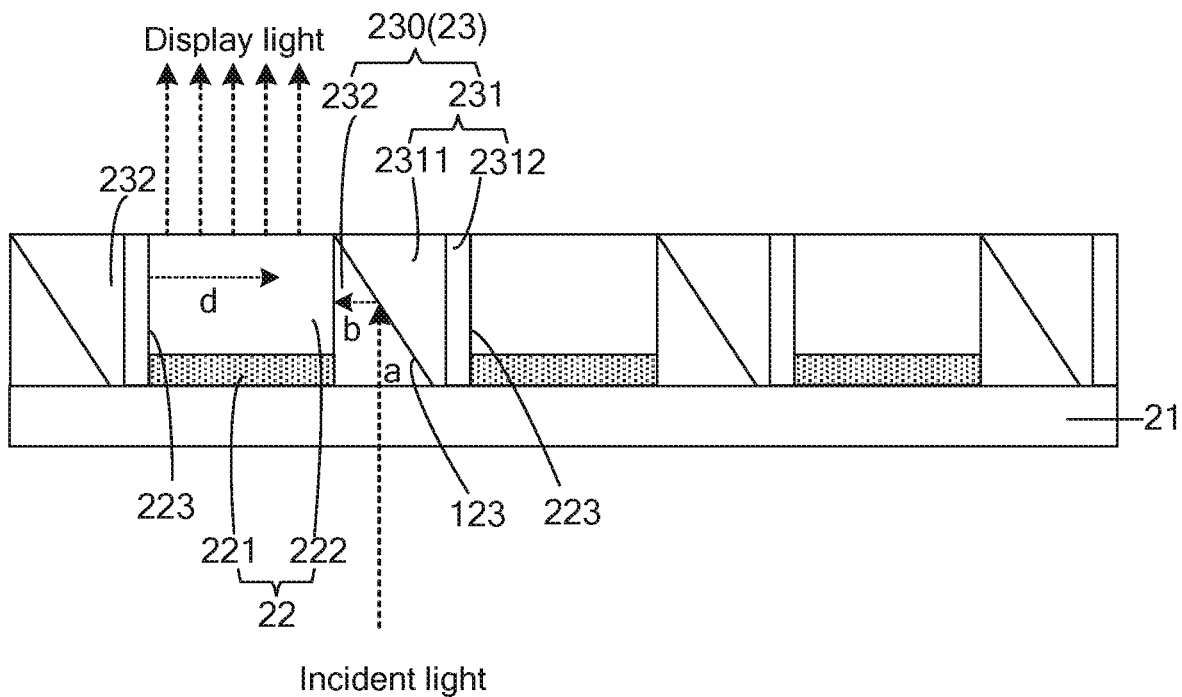
FIG. 17 is another sectional view of the display substrate in FIG. 15 along line B-B'.

In some examples, as shown in FIGS. 16 and 17, a side of the first reflecting surface 123 away from the base 21 is closer to the corresponding light output device 22 than a side of the first reflecting surface 123 proximate to the base 21. That is, the display light emitted by the light output device 22 is emergent toward the direction facing away from the base 21.

Figure 18:
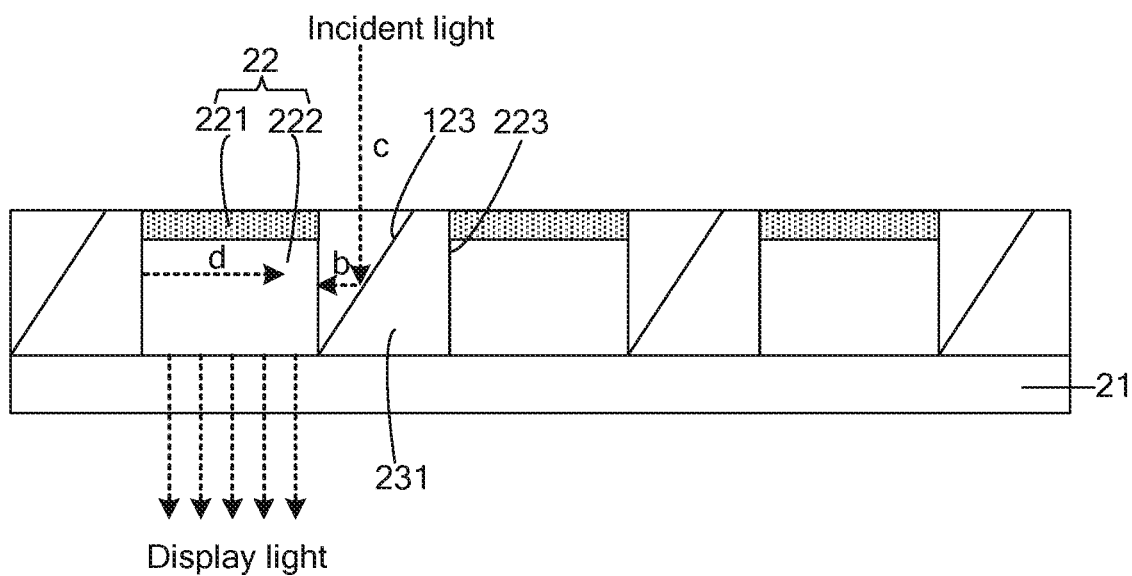
FIG. 18 is yet another sectional view of the display substrate in FIG. 15 along line B-B'.
Figure 19:
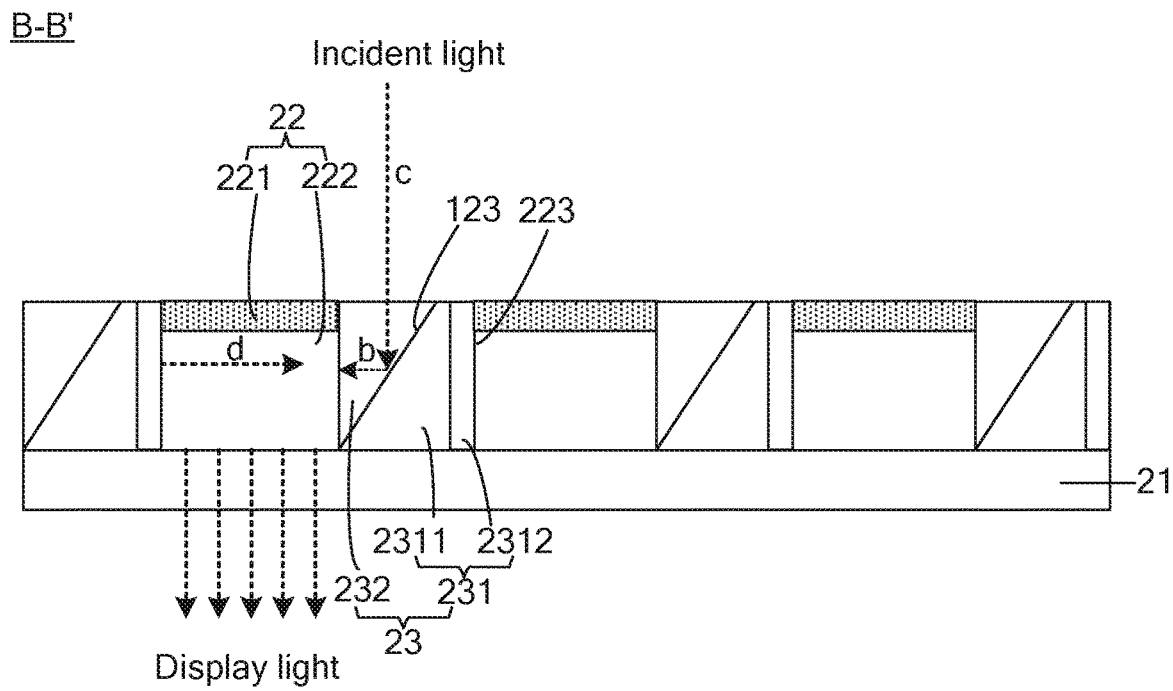
FIG. 19 is yet another sectional view of the display substrate in FIG. 15 along line B-B'.

In some other examples, as shown in FIGS. 18 and 19, a side of the first reflecting surface 123 proximate to the base 21 is closer to the corresponding light output device 22 than a side of the first reflecting surface 123 away from the base 21. That is, the display light emitted by the light output device 22 is emergent after passing through the base 21.

In the display substrate as shown in FIGS. 16 and 18, the first structure 231 is made of a reflecting material, and a surface of the first structure 231 facing away from the first reflecting surface 123 and perpendicular to the base 21 is the second reflecting surface 223.

In the display substrate as shown in FIGS. 17 and 19, the reflecting structure 230 includes a first structure 231 and a second structure 232; and the first structure 231 includes a transmission sub-portion 2311, and a reflecting sub-portion 2312 disposed on a side of the transmission sub-portion 2311 facing away from the second structure 232 and perpendicular to the base 21. The reflecting sub-portion 2312 is made of a reflecting material, to reflect the incident light that is incident to the reflecting sub-portion 2312. A surface of the reflecting sub-portion 2312 facing away from the transmission sub-portion 2311 is the second reflecting surface 223.

The reflecting material may be a material having high reflectivity to light, for example, a metal material such as Ag or Al.

As shown in FIGS. 16 to 19, the incident light that is not responded by the light output device 22 is, after passing through the light output device 22, incident to the second reflecting surface 223 corresponding to the light output device 22, and then into the light output device 22 again in the direction parallel or approximately parallel to the base 21 (i.e., the direction indicated by the dotted arrow d in FIGS. 16 to 19) after being reflected by the second reflecting surface 223, to be responded by light output device 22.

Thus, by providing, on each of two opposite sides of a light output device 22, a reflecting device 23 corresponding to this light output device 22, the incident light can be more responded by the light output device 22. The utilization of the incident light may be further increased.

It may be understood that, the arrangement as shown in FIG. 15 is exemplary. In a case where the first structure 231 further includes a second reflecting surface 223, the arrangement of a plurality of light output devices 22 and a plurality of reflecting devices 23 is not limited in the embodiments of the present disclosure, as long as one light output device 22 is disposed between any two adjacent reflecting devices 23. For example, one light output device 22 may be disposed between any two adjacent reflecting devices 23 in the row direction X in FIG. 15, and one light output device 22 may be disposed between any two adjacent reflecting devices 23 in the column direction Y in FIG. 15.

It may be further understood that, FIG. 15 exemplarily shows only a case where one reflecting device 23 is disposed on each of two opposite sides of one light output device 22, one light output device 22 may correspond to a plurality of reflecting devices 23, for example, a plurality of reflecting devices 23 may be disposed on each of two opposite sides of one light output device 22; or, a plurality of light output devices 22 may correspond to one reflecting device 23, for example, one reflecting device 23 may be disposed on each of two opposite sides of a plurality of light output devices 22.

In some embodiments, the reflecting device 23 further includes a first light-shielding layer 233, and the reflecting structure 230 and the first light-shielding layer 233 are stacked successively in a direction of the incident light that is incident to the reflecting device 23.

Figure 20:
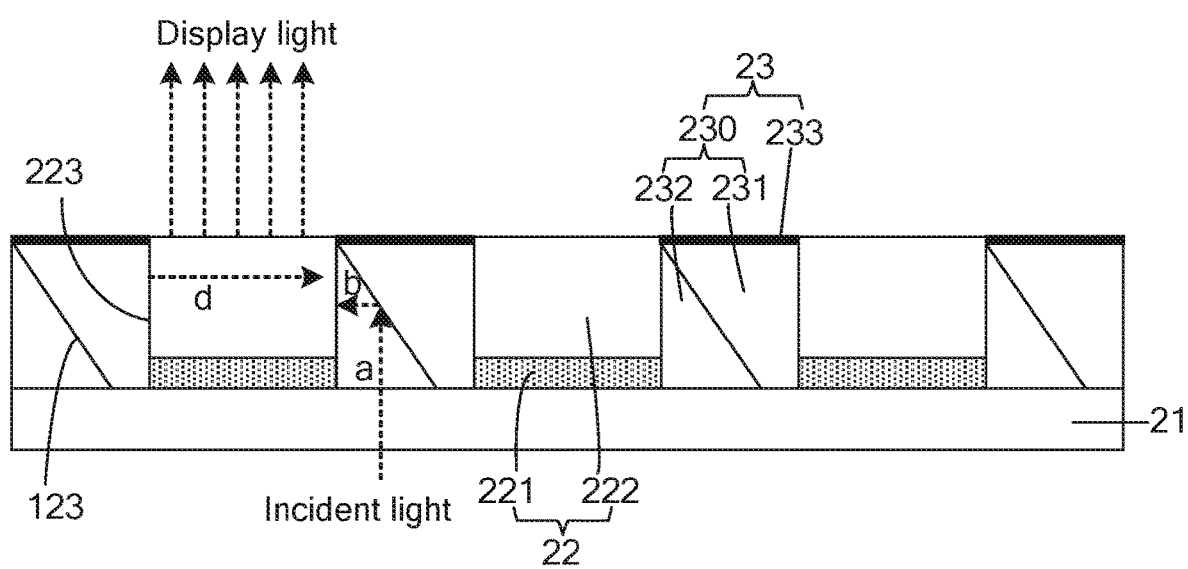
FIG. 20 is yet another sectional view of the display substrate in FIG. 15 along line B-B'.
Figure 22:
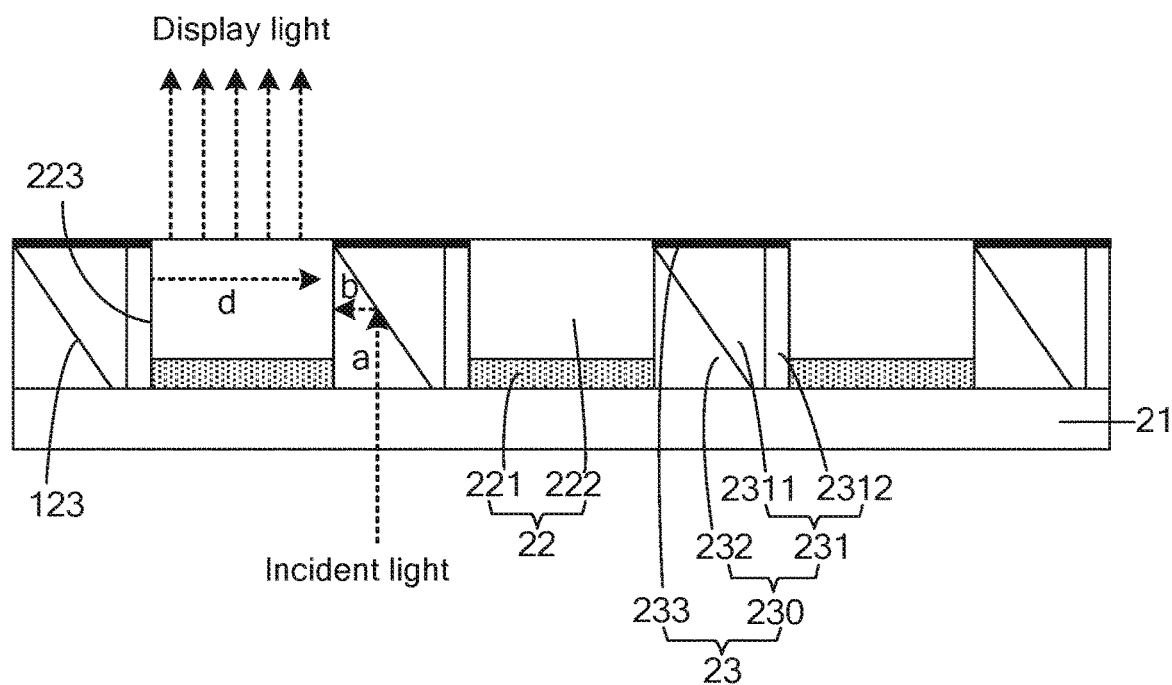
FIG. 22 is yet another sectional view of the display substrate in FIG. 15 along line B-B'.

In some example, as shown in FIGS. 20 and 22, in the case where the incident light is incident to the reflecting device 23 by passing through the base 21, the first light-shielding layer 233 is disposed on a side of the reflecting structure 230 facing away from the base 21, to avoid the possibility for part of the incident light to pass through an edge of the reflecting device 23 to be directly emergent from a side of the reflecting device 23 facing away from the base 21, thus to prevent the emergence of both the display light and the incident light (of two colors) from a light exit side of the display substrate.

Figure 21:
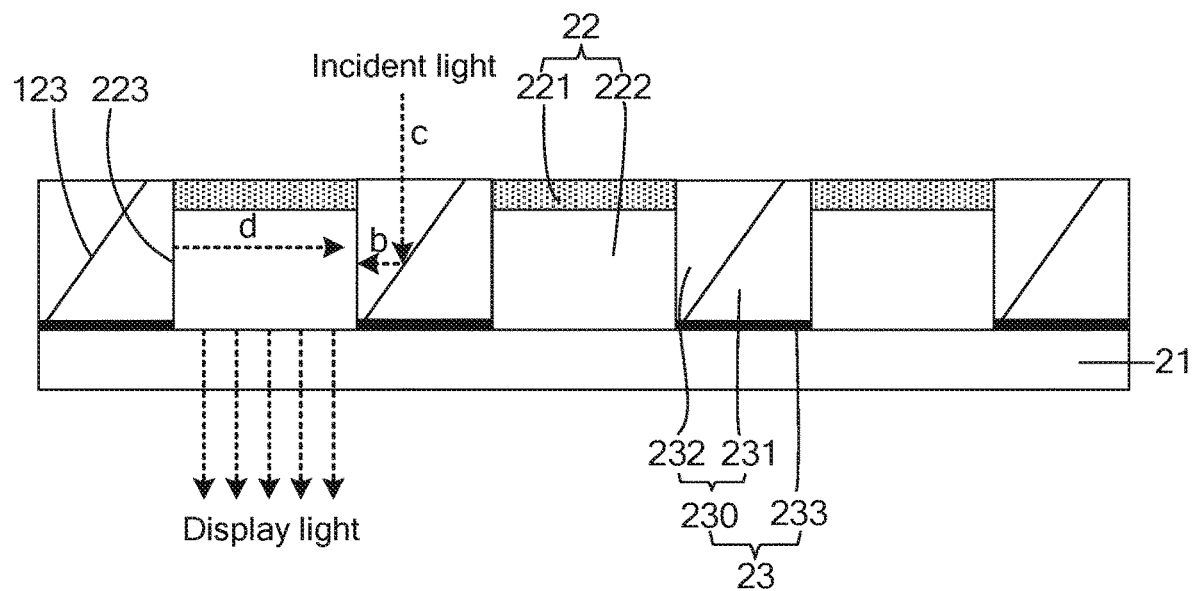
FIG. 21 is yet another sectional view of the display substrate in FIG. 15 along line B-B'.
Figure 23:
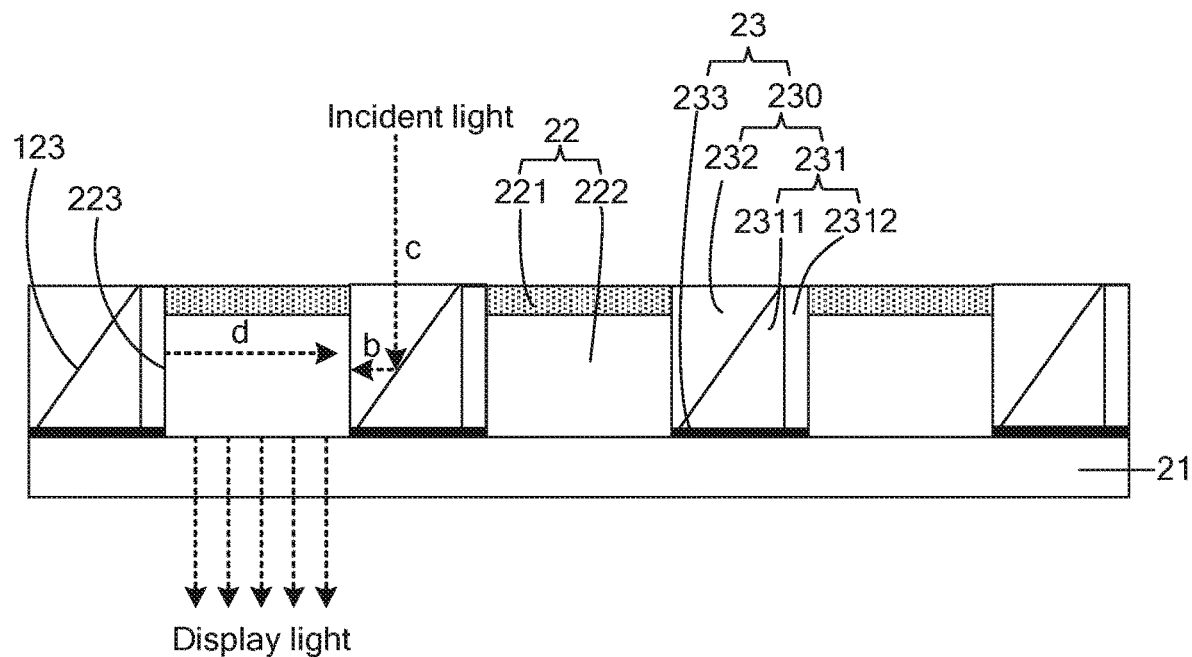
FIG. 23 is yet another sectional view of the display substrate in FIG. 15 along line B-B'.

In some other example, as shown in FIGS. 21 and 23, in the case where the incident light is incident to the reflecting device 23 without passing through the base 21, the first light-shielding layer 233 is disposed on a side of the reflecting structure 230 facing the base 21, to avoid the possibility for part of the incident light to pass through an edge of the reflecting device 23 to be directly emergent from a side of the reflecting device 23 facing the base, thus to prevent the emergence of both the display light and the incident light (of two colors) from the light exit side of the display substrate.

The first light-shielding layer 233 may be made of a material having high reflectivity to light, for example, a metal material such as Ag or Al; or, the first light-shielding layer 233 may be made of an opaque material, for example black resin material.

In some embodiments, in the direction perpendicular to the base 21, the thickness of the first structure 231 is about 85% to 95% of the thickness of the light output layer 222 (for example, the quantum dot light-emitting layer or diffuse reflecting layer). For example, the thickness of the first structure 231 is about 85%, 90% or 95% of the thickness of the light output layer 222.

In some embodiments, in the direction perpendicular to the base 21, the thickness of the first structure 231 is within a range of 6 μm to 12 μm, inclusive. For example, the thickness of the first structure 231 is 6 μm, 8 μm, 10 μm or 12 μm.

In some embodiments, in the direction perpendicular to the base 21, the thickness of the first light-shielding layer 233 is within a range of 0.6 μm to 0.8 μm, inclusive. For example, the thickness of the first light-shielding layer 233 is 0.6 μm, 0.7 μm or 0.8 μm.

In some embodiments, the base 21 has a plurality of sub-pixel regions, and each light output device 22 is disposed in one sub-pixel region. In some other embodiments, the base 21 has a plurality of sub-pixel regions, the plurality of light output devices 22 include a plurality of groups, and the display light emitted by of light output devices 22 in each group has a same color. Each group and one or more reflecting devices 23 corresponding to the group are disposed in one sub-pixel region.

Figure 24:
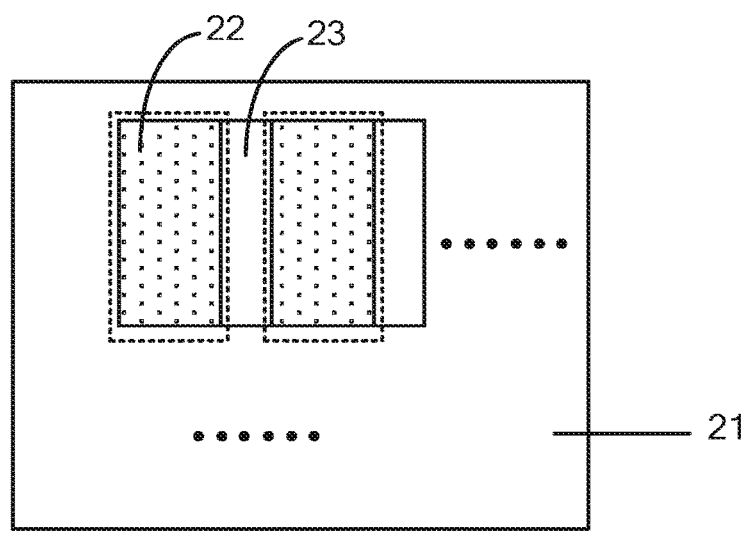
FIG. 24 is a schematic top view of a structure of yet another display substrate, according to some embodiments of the present disclosure.

For example, in a case where each light output device 22 is disposed in one sub-pixel region, as shown in FIG. 24, one light output device 22 is disposed in one sub-pixel region (as shown by the dotted box in FIG. 24). Each light output device 22 corresponds to one reflecting device 23, and the reflecting device 23 corresponding to each light output device 22 is disposed in adjacent to this light output device 22 and disposed outside this sub-pixel region.

Figure 25:
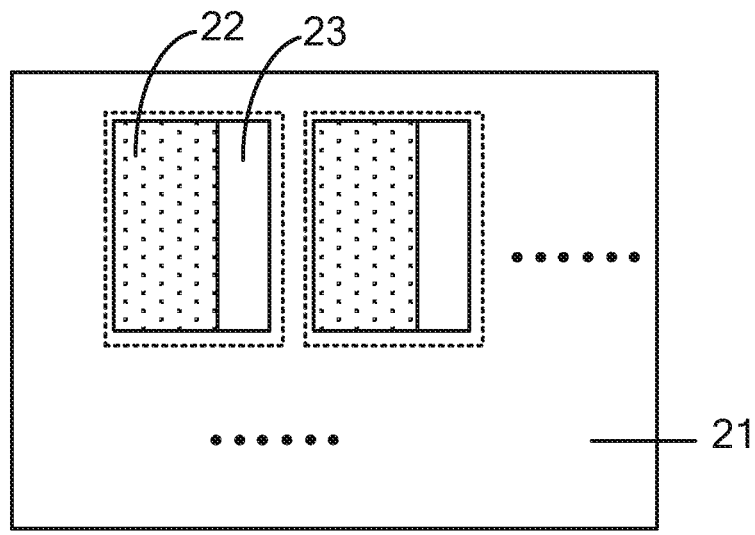
FIG. 25 is a schematic top view of a structure of yet another display substrate, according to some embodiments of the present disclosure.

For another example, in a case where each light output device 22 is disposed in one sub-pixel region, as shown in FIG. 25, one corresponding reflecting device 23 is disposed on a side of each light output device 22, and each light output device 22 and one reflecting device 23 corresponding thereto are disposed in one sub-pixel region (as shown by the dotted box in FIG. 25).

Figure 26:
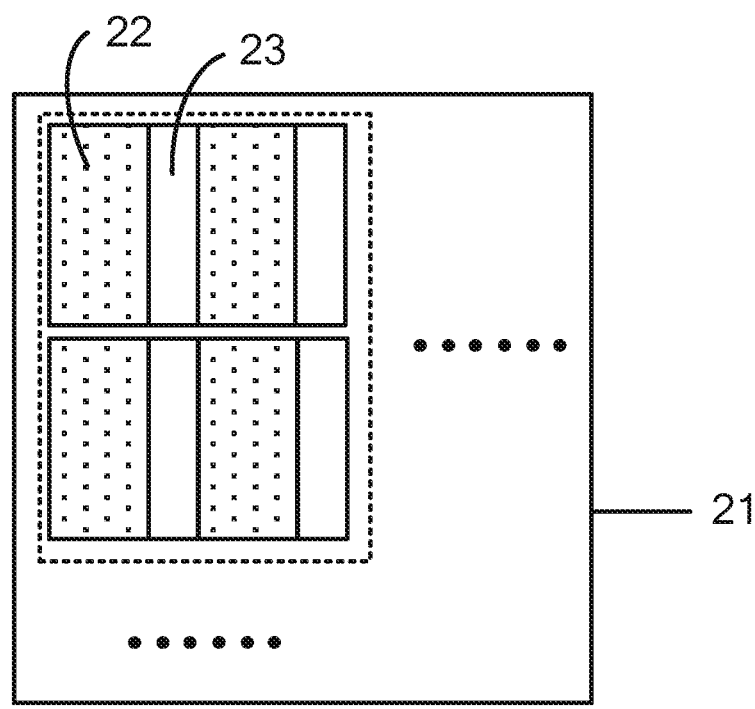
FIG. 26 is schematic a top view of a structure of yet another display substrate, according to some embodiments of the present disclosure.

For yet another example, as shown in FIG. 26, a plurality of light output devices 22 configured to emit light of a same color and a plurality of reflecting devices 23 corresponding thereto are disposed in one sub-pixel region (as shown by the dotted box in FIG. 26), and one reflecting device is disposed on a side of each light output device 22, that is, a plurality of light output devices 22 and a plurality of reflecting devices 23 corresponding thereto may be disposed in one sub-pixel region and the light output devices 22 disposed in a same sub-pixel region can emit the display light of a same color.

The plurality of light output devices 22 and the plurality of reflecting devices 23, as shown in FIGS. 24 to 26, are in one-to-one correspondence. It may be understood that the correspondence between the plurality of light output devices 22 and the plurality of reflecting devices 23 includes, but not limited to, the above-mentioned one-to-one correspondence.

For example, as shown in FIG. 4C, some light output devices 22 may correspond to one reflecting device 23 (e.g., some light output devices 22 in each column correspond to one reflecting device 23 in the row direction X); and for another example, as shown in FIG. 4C, some reflecting devices 23 may correspond to one light output device 22.

The number of light output devices 22 and reflecting devices 23 disposed in each sub-pixel region in the display substrate is not limited in the embodiments of the present disclosure.

For a large-sized display apparatus (for example, TV set or the like) each sub-pixel in the display apparatus is large in size. In this case, if only one light output device is disposed in each sub-pixel region, since the size of one light output device needs to be matched with the size of one sub-pixel region, each light output device is also large in size. It is possible to result in non-uniform light exit in different regions of each light output device, and further non-uniform light exit in this sub-pixel.

To avoid this, the size of each light output device may be reduced, to increase the light exit uniformity of each light output device. Since the size of each light output device becomes smaller and the size of the sub-pixel region remains unchanged, a plurality of light output devices 22 may be disposed in one sub-pixel region (as shown in FIG. 26). Since a light exit amount of each of the plurality of light output devices 22 is the same or approximately the same, the light exit uniformity of each sub-pixel may be improved.

For a small-sized display apparatus (for example, cell phone or the like), since each sub-pixel in the display apparatus is small in size, light output devices 22 may be disposed in one-to-one correspondence to sub-pixel regions (as shown in FIGS. 24 and 25).

In some embodiments, the display substrate is a color film substrate.

In some embodiments, the display apparatus further includes a light source configured to provide incident light.

For example, as shown in FIGS. 5A and 5B, the light source 111 is configured to provide the incident light to the display substrate.

It may be understood that, in the display apparatus, there may be one or a plurality of light sources 111.

In a case where the display apparatus includes one light source 111, a light-emitting surface of the light source 111 has a large area, to provide incident light to each light output device 22.

In a case where the display apparatus includes a plurality of light sources 111, for example, a plurality of light output devices 22 may correspond to the plurality of light sources 111; for another example, each light output device 22 may correspond to some light sources 111.

The correspondence between the plurality of light output devices 22 and the plurality of light sources 111 is not limited in the embodiments of the present disclosure.

In some examples, the display panel in the display apparatus is, for example, a liquid crystal panel. In this case, the display substrate may be an array substrate or color film substrate. If the display substrate is an array substrate in the liquid crystal panel, usually, a backlight source is disposed at the back (a surface facing away from the liquid crystal layer) of the array substrate, and thus the backlight source is the light source 111; and if the display substrate is a color film substrate in the liquid crystal panel, light emitted by the backlight source, which passes through the liquid crystal layer, is the incident light.

In some other examples, the display panel is, for example, a self-luminescence display panel (for example, OLED display panel). The OLED device is the light source 111.

In some examples, there is a plurality of light output devices 22 in the display substrate, and the plurality of light output devices 22 are all light conversion devices. In this case, taking, as an example, a case where the display light emitted by the plurality of light output devices 22 includes red light, green light and blue light, the plurality of light output devices 22 include at least one red light conversion device, at least one green light conversion device, and at least one blue light conversion device.

Each red light conversion device is configured to emit red light in response to the received incident light, each green light conversion device is configured to emit green light in response to the received incident light, and each blue light conversion device is configured to emit blue light in response to the received incident light.

To be able to excite the light conversion device to emit the display light, it is necessary to ensure that the wavelength of the incident light emitted by the light source is less than the wavelength of the display light. Since the display light includes the red light, the green light and the blue light, the wavelength (for example, within a range of 492 nm to 577 nm, inclusive) of the green light is less than the wavelength (for example, within a range of 622 nm to 770 nm, inclusive) of the red light, and the wavelength (for example, within a range of 455 nm to 492 nm, inclusive) of the blue light is less than the wavelength of the green light, that is, the blue light has a minimum wavelength among the red light, the green light and the blue light, in the case where the light output device 22 each is a light conversion device, it is necessary to ensure that the wavelength of the incident light is less than the wavelength of the blue light.

Since the wavelength (for example, within a range of 350 nm to 455 nm, inclusive) of the violet light is less than the wavelength of the blue light, in a case where the plurality of light output devices 22 include at least one red light conversion device, at least one green light conversion device and at least one blue light conversion device, the light source may be configured to provide violet incident light. For example, the wavelength of the violet incident light is 395 nm.

In some examples, there is a plurality of light output devices 22 in the display substrate, and the plurality of light output devices 22 include a plurality of light conversion devices and at least one light reflecting device. In this case, taking, as an example, a case where the display light emitted by the plurality of light output devices 22 includes red light, green light and blue light, the plurality of light output devices 22 include at least one red light conversion device, at least one green light conversion device, and at least one blue light reflecting device.

The red light conversion device and the green light conversion device may refer to the corresponding description in the above embodiments and will not be repeated here.

Since the wavelength of the green light is less than the wavelength of the red light, it is necessary to ensure that the wavelength of the incident light is less than the wavelength of the green light. In a case where the incident light is the blue light, it can ensure that the wavelength of the incident light is less than both the wavelength of the red light and green light, and it also can ensure that the display light emitted by the blue light reflecting device is the blue light.

Therefore, in a case where the plurality of light output devices 22 include at least one red light conversion device, at least one green light conversion device, and at least one blue light reflecting device, the light source may be configured to provide blue incident light.

On this basis, some embodiments of the present disclosure provide a method for manufacturing a display substrate, including: forming, above a base, at least one reflecting device and at least one light output device.

The at least one light output device and the at least one reflecting device are disposed adjacent to each other, each reflecting device is configured to reflect incident light that is incident to the reflecting device into one or more light output devices disposed on a side of the reflecting device, and each light output device is configured to emit display light in response to the received incident light.

In the embodiments of the present disclosure, according to the exit mode of the display light, there are two types of display substrates. For the first type, the display light of the display substrate is emergent in a direction facing away from the base. For the second type, the display light of the display substrate is emergent by passing through the base. The method for manufacturing a display substrate according to the embodiments of the present disclosure will be described by taking the process of manufacturing a display substrate of the first type as an example. It may be understood that the process of manufacturing a display substrate of the second type is similar to the process of manufacturing a display substrate of the first type. For a person skilled in the art, according to the specific structure of a display substrate of the second type described above, the process of manufacturing a display substrate of the second type may be obtained by referring to the process of manufacturing a display substrate of the first type, and will not be repeated here.

Figure 27:
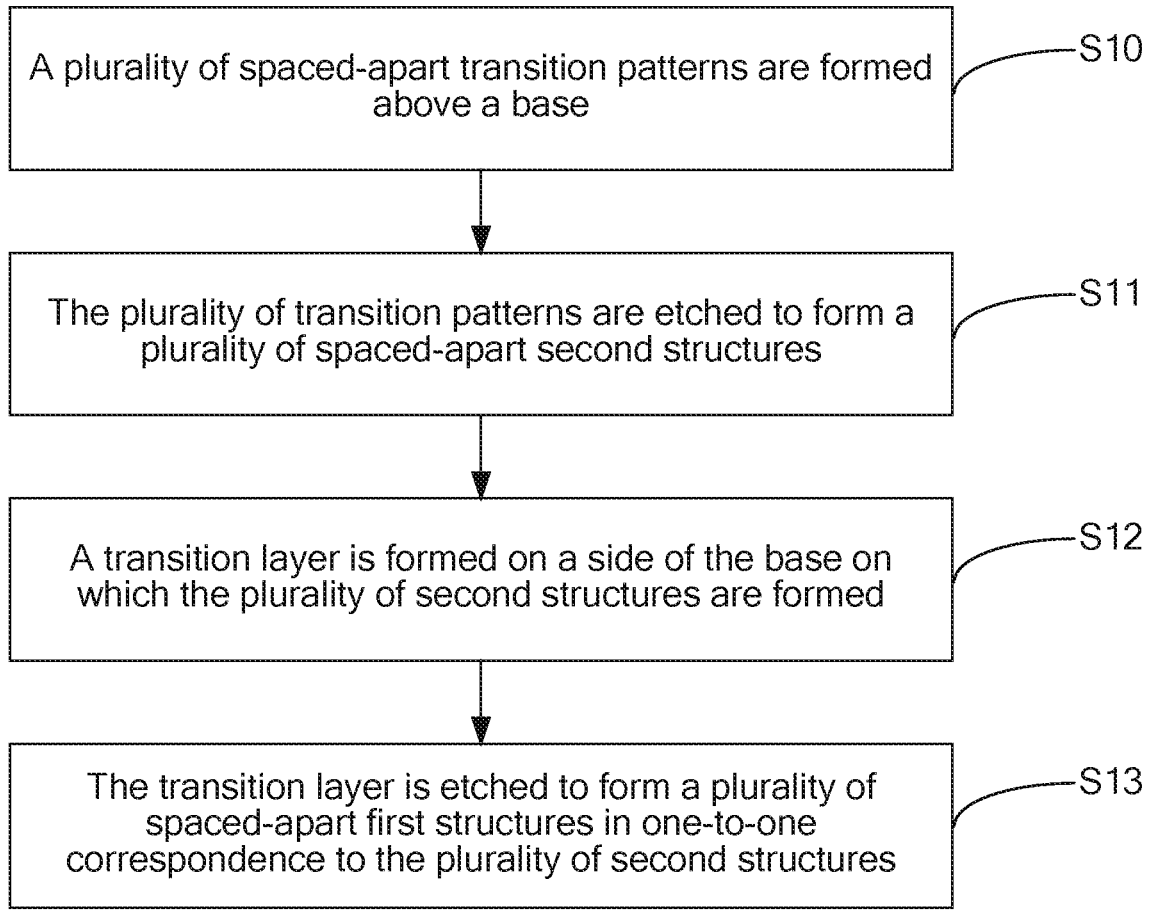
FIG. 27 is a flowchart of a method for manufacturing a display substrate, according to some embodiments of the present disclosure.
Figure 28:
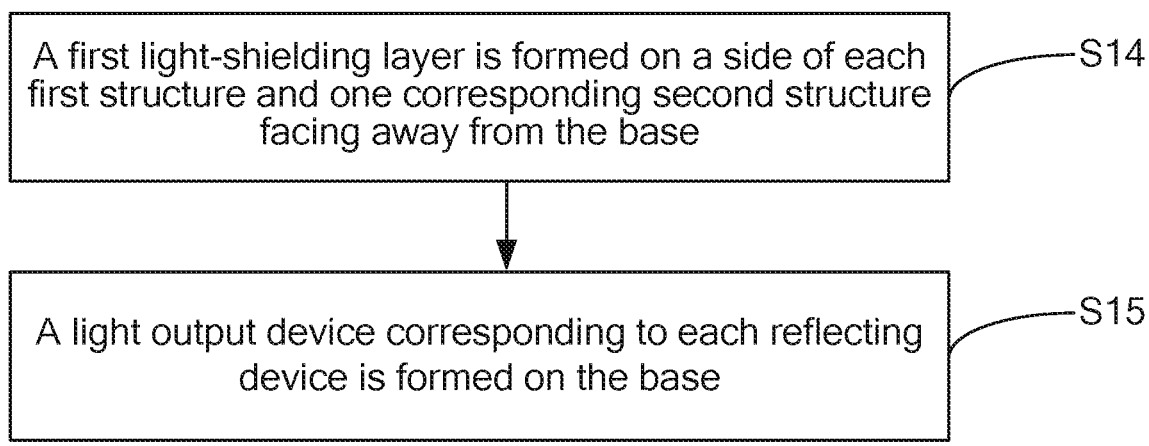
FIG. 28 is a flowchart of a method for manufacturing another display substrate, according to some embodiments of the present disclosure.

In some embodiments, as shown in FIG. 27, the method for manufacturing a display substrate may include the following steps S10-S13.

In S10, a plurality of spaced-apart transition patterns are formed above a base.

Figure 30:
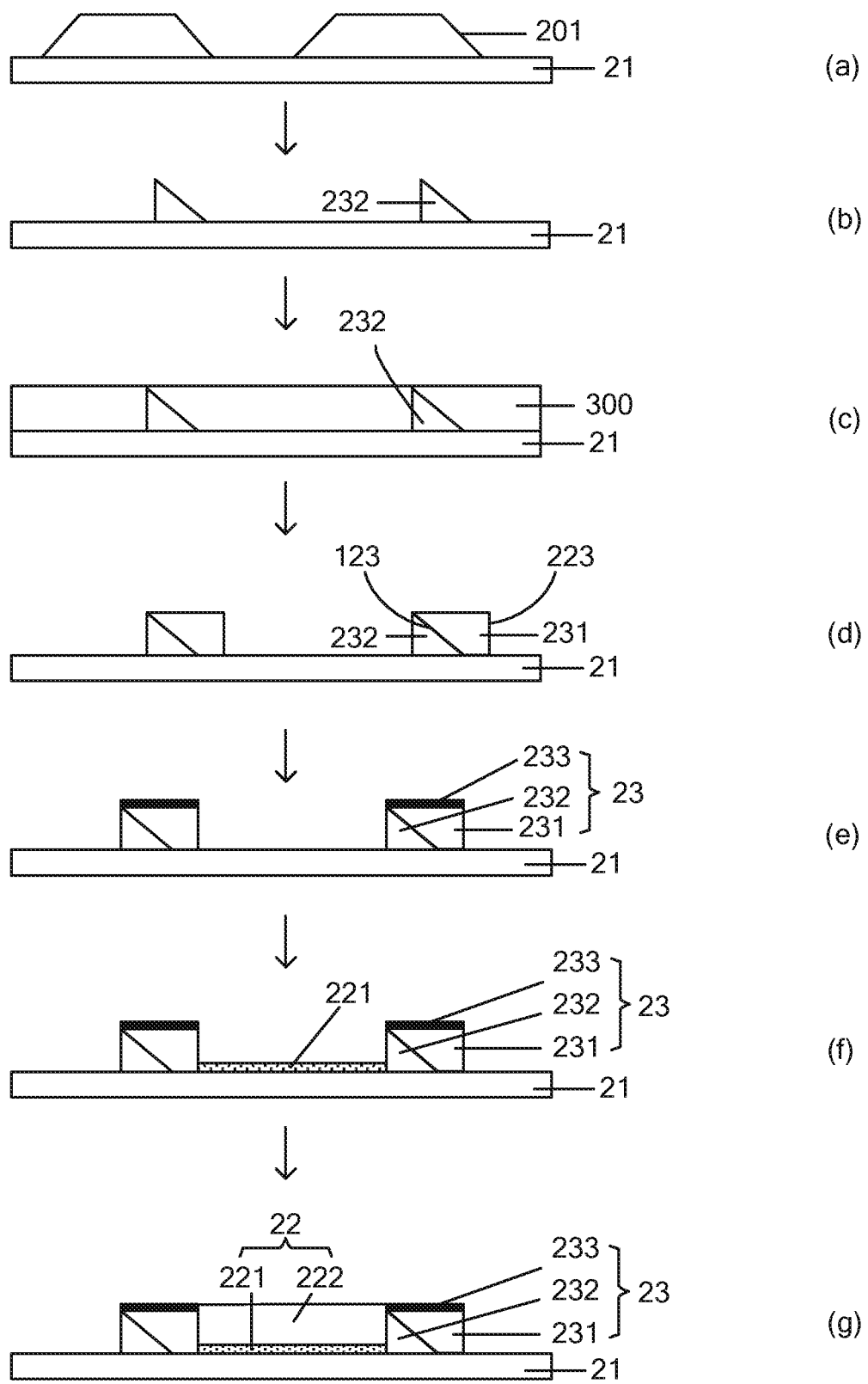
FIG. 30 is a schematic diagram showing a structure obtained by each step during manufacturing a display substrate, according to some embodiments of the present disclosure.
Figure 32:
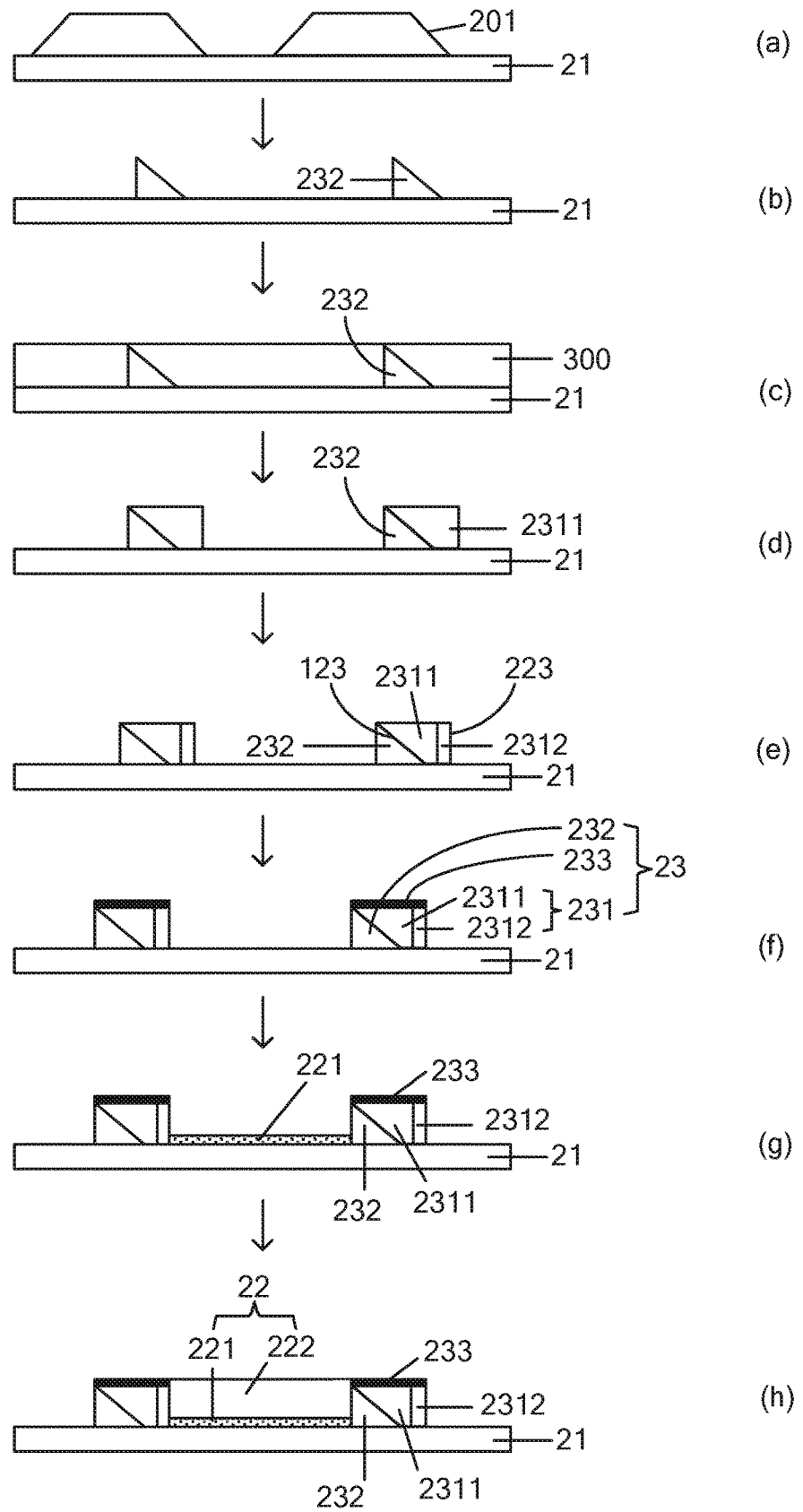
FIG. 32 is a schematic diagram showing a structure obtained by each step during manufacturing yet another display substrate, according to some embodiments of the present disclosure.

For example, as shown in part (a) in FIG. 30 and part (a) in FIG. 32, a plurality of spaced-apart transition patterns are formed above a base 21.

It should be noted that, in order to distinguish from the transition patterns in the subsequent embodiments, the transition patterns in FIGS. 30 and 32 are referred to as first transition patterns 201. A section of each first transition pattern 201 in a direction perpendicular to the base 21 is trapezoidal, and a length of a first side of the section proximate to the base 21 is greater than that of a second side of the section away from the base 21. Two sides, connecting the first side and the second side of the section, are inclined with respect to the base 21.

In some embodiments, the two sides, connecting the first side and the second side of the section, are inclined with respect to a surface of the base 21 on which the plurality of first transition patterns are formed, at an angle of 42° to 48°, inclusive, for example, of 42°, 45° or 48°.

The first transition patterns 201 are made of a light-transmitting material. For example, the first transition patterns 201 may be made of transparent resin.

In some embodiments, the plurality of first transition patterns 201 may be arranged in an array.

In S11s the plurality of transition patterns are etched to form a plurality of spaced-apart second structures.

As shown in part (b) in FIG. 30 and part (b) in FIG. 32, the plurality of first transition patterns 201 formed in S10 are etched to form a plurality of spaced-apart second structures 232.

It should be noted that, one side face of each second structure 232 is an inclined face, and an included angle between this inclined face and a surface of the base 21 on which the second structure 232 is disposed is within a range of 42° to 48°, inclusive, for example, of 42°, 45° or 48°.

Here, etching the plurality of first transition patterns 201 may be done, for example, by dry etching or wet etching. It is not limited in the embodiments of the present disclosure.

In S12, a transition layer is formed on a side of the base on which the plurality of second structures are formed.

As shown in part (c) in FIG. 30 and part (c) in FIG. 32, a transition layer 300 is formed on a side of the base 21 on which the plurality of second structures 232 are formed. The transition layer 300 covers the second structures 232.

In some embodiments, the transition layer 300 is made of a reflecting material. The reflecting material may be, for example, a metal material such as Ag or Al.

In some other embodiments, the transition layer 300 is made of a first light-emitting material, the first transition patterns 201 are made of a second light-emitting material, and a refractive index of the first light-emitting material is less than a refractive index of the second light-transmitting material.

For example, the transition layer 300 may be formed in the following way: a corresponding material (e.g., the reflecting material or the first light-emitting material) is deposited, on a side of the base 21 on which the plurality of second structures 232 are formed, to form the transition layer 300.

In S13, the transition layer is etched to form a plurality of spaced-apart first structures in one-to-one correspondence to the plurality of second structures.

It should be noted that, one reflecting device includes one first structure and one corresponding second structure, and the first structure is in contact with the inclined face of the one corresponding second structure.

In some embodiments, in a case where the transition layer 300 is made of a reflecting material, as shown in part (d) in FIG. 30, the transition layer 300 is etched and the remaining part forms a plurality of spaced-apart first structures 231.

It should be noted that, a surface of the first structure 231 in contact with the second structure 232 is an inclined surface, and this inclined surface is the first reflecting surface 123; and a surface of the first structure 231 facing away from the first reflecting surface 123 is perpendicular to the base 21, and this surface is the second reflecting surface 223.

In some other embodiments, as shown in parts (d) and (e) in FIG. 32, the first structure 231 includes a transmission sub-portion 2311 and a reflecting sub-portion 2312.

As shown in part (d) in FIG. 32, first, the transition layer 300 is etched, the remaining part forms a plurality of spaced-apart transmission sub-portion 2311, a surface of the second structure 232 in contact with the transmission sub-portion 2311 is an inclined surface, and this inclined surface is the first reflecting surface 123; and after the formation of the transmission sub-portion 2311, as shown in part (e) in FIG. 32, the reflecting sub-portion 2312 is formed on a surface of the transmission sub-portion 2311 facing away from the inclined surface, and a surface (i.e., the second reflecting surface 223) of the reflecting sub-portion 2312 facing away from the transmission sub-portion 2311 is perpendicular or approximately perpendicular to the base 21.

The reflecting sub-portion 2312 is made of a reflecting material. The reflecting material may be, for example, a metal material such as Ag or Al.

In some embodiments, etching the transition layer 300 may be done, for example, by wet etching.

In some embodiments, after S13, the method further includes the following steps S14-S15.

In S14, a first light-shielding layer is formed on a side of each first structure and one corresponding second structure facing away from the base.

For example, as shown in part (e) in FIG. 30 and part (f) in FIG. 32, a first light-shielding layer 233 is formed on a side of the first structure 231 and the corresponding second structure 232 facing away from the base 21, thus to form a reflecting device 23. That is, the reflecting device 23 includes a first structure 231, a second structure 232 and a first light-shielding layer 233.

The first light-shielding layer 233 may be made of a reflecting material. The reflecting material may be, for example, a metal material such as Ag or Al. Or, the first light-shielding layer 233 may be made of an opaque material, for example black resin material.

In S15, a light output device corresponding to each reflecting device is formed on the base.

The light output device 22 includes a light output layer 222 and a second light-shielding layer 221. In a case where the light output layer 222 is a quantum dot light-emitting layer, the light output device 22 is a light conversion device; and in a case where the light output layer 222 is a diffuse reflecting layer, the light output device 22 is a light reflecting device.

For example, as shown in parts (f) and (g) in FIG. 30, and parts (g) and (h) in FIG. 32, first, a second light-shielding layer 221 is formed on the base 21, and then a quantum dot light-emitting layer (i.e., the light output layer 222) is formed on each second light-shielding layer 221 to form a light conversion device (i.e., the light output device 22); or, a quantum dot light-emitting layer (i.e., the light output layer 222) is formed on each of some second light-shielding layers 221 to form a light conversion device (i.e., the light output device 22), and a diffuse reflecting layer (i.e., the light output layer 222) is formed on each of at least one second light-shielding layer 221 to form a light reflecting device (i.e., the light output device 22).

It should be noted that, an orthographic projection of the quantum dot light-emitting layer or the diffused reflecting layer on the base 21 is within an orthographic projection of the second light-shielding layer 221 of a same light output device 22 on the base 21.

The second light-shielding layer 221 may be made of a material having high reflectivity to light, for example, a metal material such as Ag or Al; or, the second light-shielding layer 221 may be made of an opaque material, for example black resin material.

Figure 29:
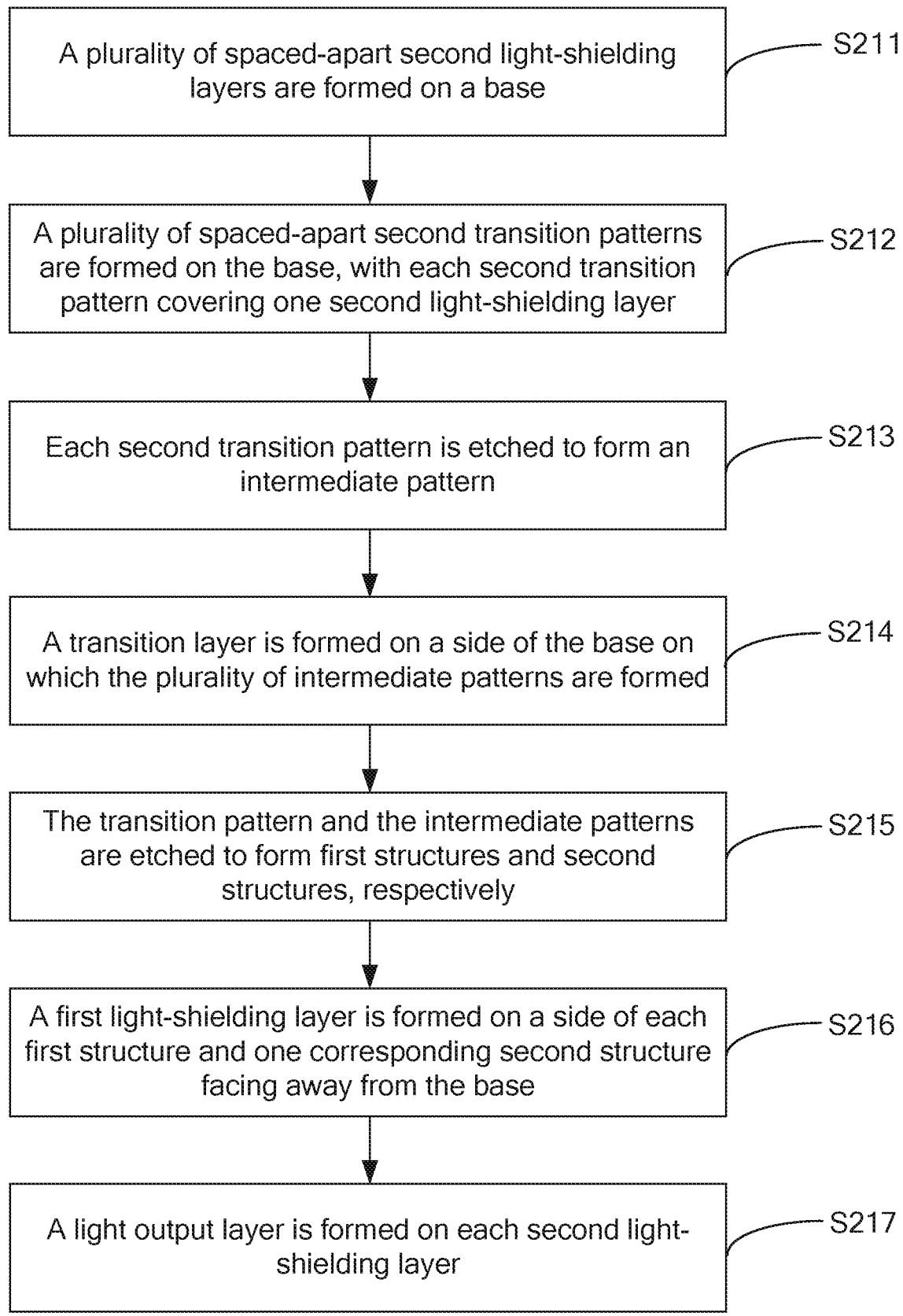
FIG. 29 is a flowchart of a method for manufacturing yet another display substrate, according to some embodiments of the present disclosure.

In some other embodiments, as shown in FIG. 29, the method for manufacturing a display substrate may include the following steps S211-S217.

In S211, a plurality of spaced-apart second light-shielding layers are formed on a base.

Figure 31:
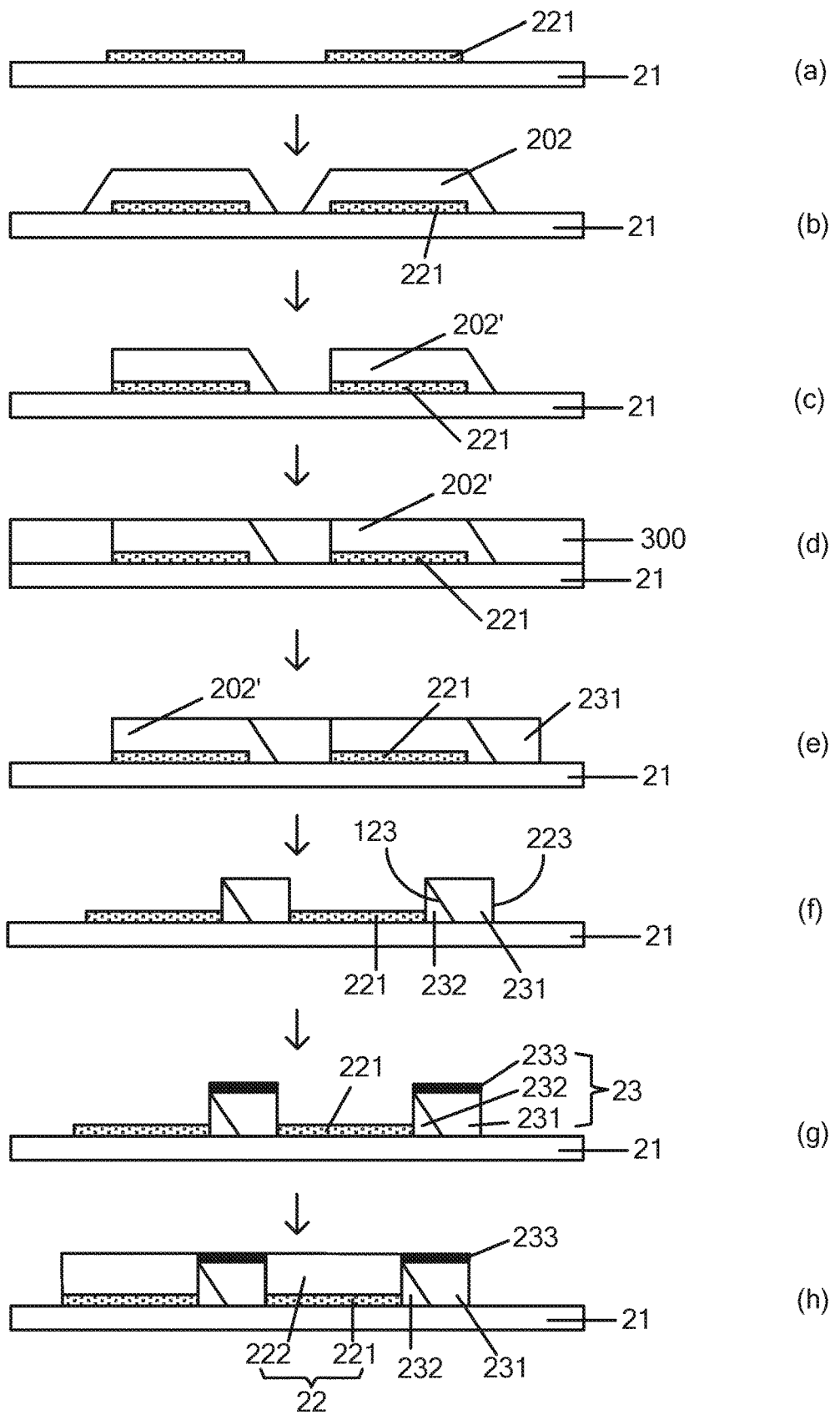
FIG. 31 is a schematic diagram showing a structure obtained by each step during manufacturing another display substrate, according to some embodiments of the present disclosure.
Figure 33:
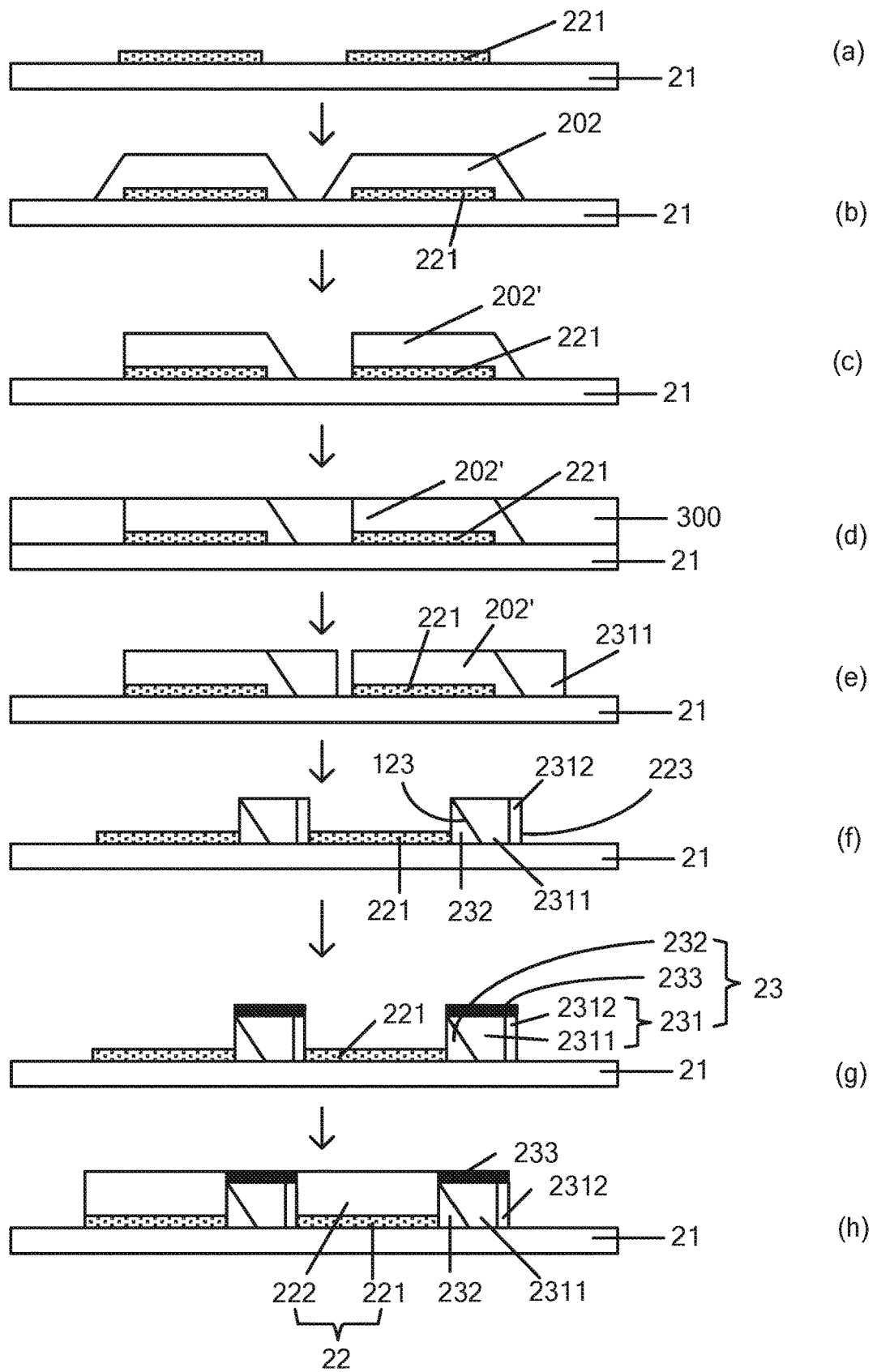
FIG. 33 is a schematic diagram showing a structure obtained by each step during manufacturing yet another display substrate, according to some embodiments of the present disclosure.

For example, as shown in part (a) in FIG. 31 and part (a) in FIG. 33, a plurality of spaced-apart second light-shielding layers 221 are formed on a base 21.

In some embodiments, the plurality of second light-shielding layers 221 may be arranged in an array.

In S212, a plurality of spaced-apart second transition patterns are formed on the base, with each second transition pattern covering one second light-shielding layer.

As shown in part (b) in FIG. 31 and part (b) in FIG. 33, a plurality of second transition patterns 202 are formed on a side of the base 21 on which the plurality of second light-shielding layers 221 are formed, with each second transition pattern 202 covering one second light-shielding layer 221.

It should be noted that, as shown in part (b) in FIG. 31 and part (b) in FIG. 33, one second transition pattern 202 and one second light-shielding layer 221 covered by the second transition pattern 202 may be considered as a first overall structure. The first integral structure has a trapezoidal section in a direction perpendicular to the base 21, and a length of a first side of the section proximate to the base 21 is greater than that of a second side of the section away from the base 21. Two sides, connecting the first side and the second side, of the section are inclined with respect to a surface of the base 21 on which the second transition patterns 202 are formed, at an angle of 42° to 48°, inclusive, for example, of 42°, 45° or 48°.

In some embodiments, in one second transition pattern 202 and one second light-shielding layer 221 covered by the second transition pattern 202, an orthographic projection of a surface of the second transition pattern 202 facing away from the base 21 is overlapped with an orthographic projection of the second light-shielding layer 221 on the base 21.

The second transition patterns 202 are made of a light-transmitting material. For example, the second transition patterns 202 may be made of transparent resin. The second light-shielding layers 221 are made of a reflecting material. The reflecting material may be, for example, a metal materials such as Ag or Al.

In S213, each second transition pattern is etched to form an intermediate pattern.

As shown in part (c) in FIG. 31 and part (c) in FIG. 33, each second transition pattern 202 is etched to form an intermediate pattern 202'.

It should be noted that, as shown in part (c) in FIG. 31 and part (c) in FIG. 33, one intermediate pattern 202' and one second light-shielding layer covered by the intermediate pattern 202' may be considered as a second overall structure. The second overall structure has a trapezoidal section in a direction perpendicular to the base 21, and a length of a first side of the section proximate to the base 21 is greater than that of a second side of the section away from the base 21. One of the two sides, connecting the first side and the second side, of the section is perpendicular to the base 21, and the other one is inclined with respect to a surface of the base 21 on which the second light-shielding layers 221 are formed, at an angle of 42° to 48°, inclusive, for example, of 42°, 45° or 48°.

In any two adjacent second overall structures, a side of the section of one second overall structure, which is perpendicular to the base 21, is adjacent to a side of the section of the other second overall structure, which is inclined with respect to the base 21.

In S214, a transition layer is formed on a side of the base on which the plurality of intermediate patterns are formed.

As shown in part (d) in FIG. 31 and part (d) in FIG. 33, a transition layer 300 is formed on a side of the base 21 on which the plurality of intermediate patterns 202' are formed.

In some embodiments, the transition layer 300 is made of a reflecting material. The reflecting material may be, for example, a metal material such as Ag or Al.

In some embodiments, the transition layer 300 is made of a first light-emitting material, the second transition patterns 202 are made of a second light-emitting material, and a refractive index of the first light-emitting material is less than a refractive index of the second light-transmitting material.

In S215, the transition pattern and the intermediate patterns are etched to form first structures and second structures, respectively.

In some embodiments, the transition layer 300 is made of a reflecting material, as shown in parts (e) and (f) in FIG. 31, first, the transition layer 300 is etched to form a plurality of spaced-apart first structures 231 as shown in part (e) in FIG. 31, and each first structure 231 is in contact with adjacent intermediate patterns 202'; and then, the intermediate patterns 202' are etched to form a plurality of spaced-apart second structures 232 as shown in part (f) in FIG. 31.

It should be noted that a surface of the first structure 231 in contact with the second structure 232 is an inclined surface.

In some embodiments, as shown in part (e) in FIG. 33, the transition layer 300 is etched to form a plurality of spaced-apart transmission sub-portions 2311. Each transmission sub-portion 2311 is disposed between two adjacent intermediate patterns 202', this transmission sub-portion 2311 is in contact with the inclined surface of one of the two intermediate patterns 202', and this transmission sub-portion 2311 is not in contact with the other one of the two intermediate patterns 202'. That is to say, there is a gap between this transmission sub-portion 2311 and the other one of the two intermediate patterns 202'.

Then, a reflecting sub-portion 2312 as shown in part (f) in FIG. 33 is formed between this transmission sub-portion 2311 and the other intermediate pattern 202' (i.e., in the above gap), and then each intermediate pattern 202' is etched to form a plurality of spaced-apart second structures 232 as shown in part (f) in FIG. 33.

It should be noted that, each reflecting sub-portion 2312 is in contact with one transmission sub-portion 2311, and a surface (i.e., the second reflecting surface 223) of each reflecting sub-portion 2312 facing away from this transmission sub-portion 2311 is perpendicular or approximately perpendicular to the base 21.

The reflecting sub-portion 2312 is made of a reflecting material. The reflecting material may be, for example, a metal material such as Ag or Al.

Etching the transition layer 300 may be done, for example, by wet etching.

In S216, a first light-shielding layer is formed on a side of each first structure and one corresponding second structure facing away from the base.

For example, as shown in part (g) in FIG. 31 and part (g) in FIG. 33, a first light-shielding layer 233 is formed on a side of each first structure 231 and one corresponding second structure 232 facing away from the base 21, to form a reflecting device 23. That is, the reflecting device 23 includes a first structure 231, a second structure 232 and a first light-shielding layer 233.

The first light-shielding layer 233 is made of a reflecting material. The reflecting material may be, for example, a metal material such as Ag or Al. The first light-shielding layer may be made of an opaque material, for example black resin material.

In S217, a light output layer is formed on each second light-shielding layer.

As shown in part (h) in FIG. 31 and part (h) in FIG. 33, a quantum dot light-emitting layer (i.e., the light output layer 222) is formed on each second light-shielding layer 221 to form a light conversion device (i.e., the light output device 22); or, a quantum dot light-emitting layer (i.e., the light output layer 222) is formed on each of some second light-shielding layers 221 to form a light conversion device (i.e., the light output device 22), and a diffuse reflecting layer (i.e., the light output layer 222) is formed on each of at least one second light-shielding layer 221 to form a light reflecting device (i.e., the light output device 22).

It should be noted that, an orthographic projection of the quantum dot light-emitting layer or the diffused reflecting layer on the base 21 is within an orthographic projection of the second light-shielding layer 221 of a same light output device 22 on the base 21.

It may be understood that, in the above embodiments, after the formation of the first structure 231, the second reflecting surface 223 in the first structure 231 may be smoothened by laser or by etching, so that the second reflecting surface 223 can reflect the incident light in a specular manner, so as to effectively ensure that the incident light reflected by the second reflecting surface 223 can enter the light output device 22 in the direction parallel or approximately parallel to the base 21. This avoids the loss of light energy, caused by the reflection of the incident light out of the light output device 22 after it is diffuse reflected by the second reflecting surface 223. The utilization of the incident light is further increased.

In the above method provided by the embodiment of the present disclosure, the formation of any structure with one corresponding pattern may be performed by a patterning process. The above patterning process includes a photolithography process, or a process including a photolithography process and an etching process. The photolithography process refers to a process including a film formation (for example, a film formation by chemical vapor deposition (CVD)), an exposure, a development, and the like, and forming a pattern by using a photoresist, a mask, an exposure machine, or the like.

The above description is just the specific implementation of the present disclosure, and the protection scope of the present disclosure is not limited thereto. Any changes or replacements obtained by a person of ordinary skill in the art without departing from the technical scope of the present disclosure should be included within the protection scope of the present disclosure. Therefore, the protection scope of the present disclosure shall be subject to the protection scope of the claims.

What is claimed is:

1. A display substrate, comprising:
   a base; and
   at least one light output device and at least one reflecting device both disposed above the base; wherein
   the at least one light output device and the at least one reflecting device are disposed adjacent to each other; an orthographic projection of the at least one light output device on the base does not overlap with an orthographic projection of the at least one reflecting device on the base;
   each reflecting device is configured to reflect incident light that is incident to the reflecting device in a direction perpendicular to the base into one or more light output devices disposed on a side of the reflecting device; and the reflecting device includes a reflecting structure, and the reflecting structure includes a first structure and a second structure;
   each light output device is configured to emit display light in response to the received incident light; and
   the at least one light output device includes:
   at least one red light conversion device configured to emit red display light in response to the received incident light; and
   at least one green light conversion device configured to emit green display light in response to the received incident light; and
   at least one blue light conversion device configured to emit blue display light in response to the received incident light; or, at least one blue light reflecting device each including a diffuse reflecting layer, and the diffuse reflecting layer including a plurality of diffusion particles configured to reflect incident light that is incident into the blue light reflecting device out of the blue light reflecting device.

2. The display substrate according to claim 1, wherein the first structure is made of a reflecting material; wherein
   the first structure includes a first reflecting surface inclined with respect to the base, and the first reflecting surface is configured to reflect the incident light that is incident to the first reflecting surface into the one or more light output devices disposed on a side of the first reflecting surface.

3. The display substrate according to claim 2, wherein the second structure is made of a light-transmitting material, and the second structure is disposed on a side of the first reflecting surface facing the one or more light output devices disposed on the side of the first reflecting surface.

4. The display substrate according to claim 2, wherein the first structure further includes a second reflecting surface facing away from the first reflecting surface and perpendicular to the base.

5. The display substrate according to claim 2, wherein an included angle between the first reflecting surface and the base is within a range of 42° to 48°, inclusive.

6. The display substrate according to claim 2, wherein the reflecting device further includes a first light-shielding layer, and the reflecting structure and the first light-shielding layer are stacked successively in a direction of the incident light that is incident to the reflecting device.

7. The display substrate according to claim 1, wherein
   the second structure is closer to the one or more light output devices disposed on the side of the reflecting device than the first structure;
   the first structure includes a transmission sub-portion that is in contact with the second structure and made of a first light-transmitting material; and
   the second structure is made of a second light-transmitting material, and a refractive index of the second light-transmitting material is greater than a refractive index of the first light-transmitting material; and the second structure includes a first reflecting surface inclined with respect to the base and in contact with the transmission sub-portion, and the first reflecting surface is configured to reflect the incident light that is incident to the first reflecting surface into the one or more light output devices disposed on a side of the first reflecting surface.

8. The display substrate according to claim 7, wherein the first structure further includes a reflecting sub-portion disposed on a side of the transmission sub-portion facing away from the second structure and perpendicular to the base.

9. The display substrate according to claim 7, wherein an included angle between the first reflecting surface and the base is within a range of 42° to 48°, inclusive.

10. The display substrate according to claim 7, wherein the reflecting device further includes a first light-shielding layer, and the reflecting structure and the first light-shielding layer are stacked successively in a direction of the incident light that is incident to the reflecting device.

11. The display substrate according to claim 1, wherein the at least light output device includes a plurality of light output devices, and the at least one reflecting device includes a plurality of reflecting devices; and
the plurality of reflecting devices and the plurality of light output devices are arranged in at least one of following ways:
a side of one light output device corresponds to one reflecting device;
a side of one light output device corresponds to some of the plurality of reflecting devices; or
some of the plurality of light output devices correspond to one reflecting device.

12. The display substrate according to claim 11, wherein the base has a plurality of sub-pixel regions, and each light output device is disposed in one sub-pixel region.

13. The display substrate according to claim 11, wherein the plurality of light output devices include a plurality of groups, and the display light emitted by light output devices in each group has a same color; and
the base has a plurality of sub-pixel regions, and each group and one or more reflecting devices corresponding to the group are disposed in one sub-pixel region.

14. The display substrate according to claim 1, wherein one light output device includes: a second light-shielding layer and a light output layer successively stacked in an exit direction of the display light; wherein
the light output layer includes a quantum dot light-emitting layer or a diffuse reflecting layer.

15. A display apparatus, comprising:
the display substrate according to claim 1; and
a light source configured to provide the incident light to the display substrate.

16. The display apparatus according to claim 15, wherein
the light source is configured to provide blue incident light, and the at least one light output device includes: the at least one red light conversion device, the at least one green light conversion device, and the at least one blue light reflecting device;
or
the light source is configured to provide violet incident light, and the at least one light output device includes: the at least one red light conversion device, the at least one green light conversion device, and the at least one blue light conversion device.

17. A method for manufacturing a display substrate, comprising:
forming, above a base, at least one reflecting device and at least one light output device; wherein
the at least one light output device and the at least one reflecting device are disposed adjacent to each other, each reflecting device is configured to reflect incident light that is incident to the reflecting device in a direction perpendicular to the base into one or more light output devices disposed on a side of the reflecting device, and each light output device is configured to emit display light in response to the received incident light;
wherein forming, above the base, the at least one reflecting device includes:
forming, above the base, a plurality of spaced-apart transition patterns; wherein a section of each transition pattern in a direction perpendicular to the base is trapezoidal, and a length of a first side of the section proximate to the base is greater than a length of a second side of the section away from the base;
etching the plurality of transition patterns to form a plurality of spaced-apart second structures; wherein with respect to the base, a side face of each second structure is an inclined face;
forming a transition layer on a side of the base on which the plurality of second structures are formed; and
etching the transition layer to form a plurality of spaced-apart first structures in one-to-one correspondence to the plurality of second structures; wherein each reflecting device includes one first structure and one corresponding second structure, and the first structure is in contact with the inclined face of the corresponding second structure;
wherein an orthographic projection of the at least one light output device on the base does not overlap with an orthographic projection of the at least one reflecting device on the base;
wherein forming, above the base, the at least one light output device includes:
forming a second light-shielding layer on the base;
forming a quantum dot light-emitting layer on each second light-shielding layer to form a light conversion device; or, forming a quantum dot light-emitting layer on each of some second light-shielding layer to form a light conversion device; or forming a diffuse reflecting layer on each of at least one second light-shielding layer to form a light reflecting device; wherein
the at least one light output device includes:
at least one red light conversion device configured to emit red display light in response to the received incident light; and
at least one green light conversion device configured to emit green display light in response to the received incident light; and
at least one blue light conversion device configured to emit blue display light in response to the received incident light or, at least one blue light reflecting device each including a diffuse reflecting layer, and the diffuse reflecting layer including a plurality of diffusion particles configured to reflect incident light that is incident into the blue light reflecting device out of the blue light reflecting device.

18. The method according to claim 17, wherein after the first structure in contact with the inclined face of the second structure is formed, forming at least one reflecting device on the base further includes:
forming a first light-shielding layer on a side of each first structure and one corresponding second structure facing away from the base.

* * * * *